(12) United States Patent
Wu et al.

(10) Patent No.: US 11,706,886 B2
(45) Date of Patent: Jul. 18, 2023

(54) FOLDING APPARATUS AND ELECTRONIC DEVICE

(71) Applicant: HUAWEI TECHNOLOGIES CO., LTD., Shenzhen (CN)

(72) Inventors: Weifeng Wu, Shenzhen (CN); Tao Huang, Dongguan (CN); Li Liao, Dongguan (CN); Qiang Zhan, Shanghai (CN); Haiqiang Tian, Dongguan (CN); Yuehua Hu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/487,292

(22) Filed: Sep. 28, 2021

(65) Prior Publication Data

US 2022/0104370 A1    Mar. 31, 2022

(30) Foreign Application Priority Data

Sep. 30, 2020   (CN) .......................... 202011062457.7

(51) Int. Cl.
*H05K 5/02*      (2006.01)
*H05K 5/00*      (2006.01)

(52) U.S. Cl.
CPC .......... *H05K 5/0217* (2013.01); *H05K 5/0017* (2013.01)

(58) Field of Classification Search
CPC .... G06F 1/1616; G06F 1/1652; G06F 1/1681; H05K 5/0217; H05K 5/0017; G09F 9/301
See application file for complete search history.

(56) References Cited

U.S. PATENT DOCUMENTS

| 9,021,657 | B2 | 5/2015 | Park et al. |
| 9,348,450 | B1 | 5/2016 | Kim |
| 9,677,308 | B1 | 6/2017 | Chen et al. |
| 10,036,188 | B1 * | 7/2018 | Yao ........................ G06F 1/1681 |
| 10,231,347 | B2 | 3/2019 | Seo et al. |
| 10,469,635 | B1 | 11/2019 | Carlson et al. |
| 10,487,550 | B2 | 11/2019 | Chu |

(Continued)

FOREIGN PATENT DOCUMENTS

| CN | 1681380 A | 10/2005 |
| CN | 101840247 A | 9/2010 |

(Continued)

*Primary Examiner* — Abhishek M Rathod
(74) *Attorney, Agent, or Firm* — Maier & Maier, PLLC

(57) ABSTRACT

A folding apparatus includes a first housing, a first support plate, a middle housing, a first mounting bracket, a first transmission arm, and a first rotating arm. The first mounting bracket is fixed to the first housing, the first transmission arm is rotatably connected to the middle housing, a rotation center is a first axis, and the first transmission arm is slidably connected to the first mounting bracket and slidably connected to the first support plate. The first rotating arm is rotatably connected to the middle housing, a rotation center is a second axis, the first rotating arm is rotatably connected to the first mounting bracket, and the second axis and the first axis are not collinear. The first support plate is rotatably connected to the first mounting bracket, so that the first housing and the first support plate switch between a flattened state and a folded state.

20 Claims, 17 Drawing Sheets

(56) References Cited

U.S. PATENT DOCUMENTS

| | | | |
|---|---|---|---|
| 10,845,850 | B1 | 11/2020 | Kang et al. |
| 11,231,754 | B2 | 1/2022 | Kang et al. |
| 11,467,633 | B2 | 10/2022 | Liao et al. |
| 2007/0129609 | A1 | 6/2007 | Kawasaki |
| 2014/0217875 | A1 | 8/2014 | Park et al. |
| 2015/0233162 | A1 | 8/2015 | Lee et al. |
| 2016/0116944 | A1 | 4/2016 | Lee et al. |
| 2016/0302314 | A1* | 10/2016 | Bae .................... G06F 1/16 |
| 2017/0142240 | A1 | 5/2017 | Xu |
| 2017/0365197 | A1 | 12/2017 | Kim et al. |
| 2018/0024589 | A1 | 1/2018 | Nakamura et al. |
| 2018/0049329 | A1 | 2/2018 | Seo et al. |
| 2019/0163241 | A1 | 5/2019 | Moon et al. |
| 2019/0196543 | A1 | 6/2019 | Mizoguchi et al. |
| 2019/0207141 | A1 | 7/2019 | Kim et al. |
| 2019/0268456 | A1* | 8/2019 | Park ................ H04M 1/0268 |
| 2019/0286195 | A1 | 9/2019 | Lin |
| 2019/0390703 | A1 | 12/2019 | Hsu |
| 2020/0097051 | A1 | 3/2020 | Liu |
| 2020/0267851 | A1 | 8/2020 | Hou et al. |
| 2020/0348732 | A1* | 11/2020 | Kang ................ G06F 1/1681 |
| 2021/0041921 | A1 | 2/2021 | Kang et al. |
| 2021/0181808 | A1 | 6/2021 | Liao et al. |
| 2021/0267077 | A1 | 8/2021 | Zhang et al. |
| 2021/0373612 | A1 | 12/2021 | Hwang et al. |
| 2022/0011828 | A1 | 1/2022 | Zhan et al. |
| 2022/0104370 | A1 | 3/2022 | Wu et al. |
| 2022/0113770 | A1 | 4/2022 | Kang et al. |
| 2022/0137676 | A1 | 5/2022 | Tian et al. |
| 2022/0217859 | A1 | 7/2022 | Lee et al. |
| 2022/0303371 | A1 | 9/2022 | Liao et al. |
| 2022/0377919 | A1 | 11/2022 | Zhang et al. |

FOREIGN PATENT DOCUMENTS

| | | | |
|---|---|---|---|
| CN | 103167071 | A | 6/2013 |
| CN | 104836865 | A | 8/2015 |
| CN | 105096752 | A | 11/2015 |
| CN | 105491193 | A | 4/2016 |
| CN | 205750631 | U | 11/2016 |
| CN | 205881905 | U | 1/2017 |
| CN | 106601130 | A | 4/2017 |
| CN | 107632661 | A | 1/2018 |
| CN | 207010739 | U | 2/2018 |
| CN | 207115888 | U | 3/2018 |
| CN | 108173995 | A | 6/2018 |
| CN | 108665812 | A | 10/2018 |
| CN | 108712535 | A | 10/2018 |
| CN | 109032251 | A | 12/2018 |
| CN | 109118964 | A | 1/2019 |
| CN | 109257460 | A | 1/2019 |
| CN | 208421695 | U | 1/2019 |
| CN | 208421695 | U * | 1/2019 |
| CN | 208596323 | U | 3/2019 |
| CN | 208622359 | U | 3/2019 |
| CN | 109658826 | A | 4/2019 |
| CN | 109686267 | A | 4/2019 |
| CN | 208689844 | U | 4/2019 |
| CN | 109830185 | A | 5/2019 |
| CN | 208922657 | U | 5/2019 |
| CN | 109859630 | A | 6/2019 |
| CN | 109979328 | A | 7/2019 |
| CN | 110007715 | A | 7/2019 |
| CN | 110010008 | A | 7/2019 |
| CN | 110022386 | A | 7/2019 |
| CN | 110058444 | A | 7/2019 |
| CN | 110061039 | A | 7/2019 |
| CN | 110166591 | A | 8/2019 |
| CN | 110189638 | A | 8/2019 |
| CN | 110265438 | A | 9/2019 |
| CN | 209358590 | U | 9/2019 |
| CN | 209375705 | U | 9/2019 |
| CN | 209414382 | U | 9/2019 |
| CN | 209430596 | U | 9/2019 |
| CN | 209545628 | U | 10/2019 |
| CN | 209545628 | U * | 10/2019 |
| CN | 110445913 | A | 11/2019 |
| CN | 209593488 | U | 11/2019 |
| CN | 110552953 | A | 12/2019 |
| CN | 110557481 | A | 12/2019 |
| CN | 110580854 | A | 12/2019 |
| CN | 209724948 | U | 12/2019 |
| CN | 209731301 | U | 12/2019 |
| CN | 209860956 | U | 12/2019 |
| CN | 110671423 | A | 1/2020 |
| CN | 110853510 | A | 2/2020 |
| CN | 110985524 | A | 4/2020 |
| CN | 110992833 | A | 4/2020 |
| CN | 111327739 | A | 6/2020 |
| CN | 210799707 | U | 6/2020 |
| CN | 111615277 | A | 9/2020 |
| CN | 111653202 | A | 9/2020 |
| CN | 111677747 | A | 9/2020 |
| CN | 113053238 | A | 6/2021 |
| KR | 101487189 | B1 | 1/2015 |
| KR | 1020160089164 | A | 7/2016 |
| KR | 102007426 | B1 | 8/2019 |
| KR | 102152040 | B1 | 9/2020 |
| RU | 2596469 | C2 | 9/2016 |
| RU | 2683290 | C2 | 3/2019 |
| WO | 2015126068 | A1 | 8/2015 |
| WO | 2017160680 | A1 | 9/2017 |
| WO | 2018070778 | A1 | 4/2018 |
| WO | 2018082338 | A1 | 5/2018 |
| WO | 2019151839 | A1 | 8/2019 |
| WO | 2019223009 | A1 | 11/2019 |
| WO | 2019227296 | A1 | 12/2019 |
| WO | 2020057032 | A1 | 3/2020 |

* cited by examiner

FOLDING APPARATUS AND ELECTRONIC DEVICE

CROSS-REFERENCE TO RELATED DISCLOSURES

This application claims priority to Chinese Patent Application No. 202011062457.7, filed on Sep. 30, 2020. which is hereby incorporated by reference in its entirety.

TECHNICAL FIELD

The embodiments relate to the field of foldable electronic product technologies, and in particular, to a folding apparatus and an electronic device.

BACKGROUND

As a flexible foldable screen technology becomes increasingly mature, a folding apparatus capable of carrying a flexible display has become a major trend. The folding apparatus needs to have relatively high reliability and relatively good operation experience. The folding apparatus usually includes two housings and a foldable mechanism connected between the two housings. The foldable mechanism can control, through deformation, the two housings to be folded or unfolded relative to each other, and drive the flexible display to be folded or unfolded.

The foldable mechanism of the folding apparatus usually includes two rotatable support plates separately connected to the two housings. The two rotatable support plates can support the screen in a flattened state of the folding apparatus, and form space for accommodating the screen in a folded state of the folding apparatus. However, the conventional foldable mechanism has no active driving structure for actively driving the rotatable support plate to move. Therefore, unsmoothness and jamming easily occur during movement, resulting in low reliability.

SUMMARY

Embodiments provide a folding apparatus and an electronic device. The folding apparatus has an active driving structure for actively driving a rotatable support plate to move, so that the rotatable support plate can obtain sufficient driving force during movement to move smoothly and stably, thereby achieving high reliability.

According to a first aspect, the embodiments provide a folding apparatus. The folding apparatus includes a first housing, a first support plate, and a middle housing that are configured to support a flexible display and that are sequentially arranged in an extension direction of the flexible display. The folding apparatus further includes a first mounting bracket, a first transmission arm, and a first rotating arm.

The first mounting bracket is fixed to the first housing. The first transmission arm is rotatably connected to the middle housing, and a rotation center is a first axis. The first transmission arm is slidably connected to the first mounting bracket. The first transmission arm is slidably connected to the first support plate.

The first rotating arm is rotatably connected to the middle housing, and a rotation center is a second axis. The first rotating arm is rotatably connected to the first mounting bracket. The second axis and the first axis are not collinear.

The first support plate is rotatably connected to the first mounting bracket, and the first support plate can be driven by the first transmission arm, through sliding of the first transmission arm relative to the first mounting bracket, to rotate relative to the middle housing, so that the first housing, the first support plate, and the middle housing switch between a flattened state and a folded state.

It should be noted that the flattened state may be understood as that the first housing and the first support plate do not rotate relative to the middle housing, so that the first housing, the first support plate, and the middle housing are flush with each other to jointly support the flexible display. For example, in the flattened state, the first housing, the first support plate, and the middle housing may be arranged in a straight line shape. The folded state may be understood as that the first housing and the first support plate rotate relative to the middle housing, so that the first housing and the first support plate are disposed at an included angle with the middle housing to form accommodation space for accommodating the flexible display. For example, in the folded state, the first housing, the first support plate, and the middle housing may be arranged in an arc shape.

It can be understood that the first transmission arm can rotate relative to the middle housing. In other words, the first transmission arm has a rotation center, and the rotation center of the first transmission arm is the first axis. The rotation center (the first axis) of the first transmission arm is a rotation center around which the first transmission arm rotates relative to the middle housing and may be understood as a straight line around which the first transmission arm can rotate relative to the middle housing in an angle range of 0° to 90°. The first rotating arm can also rotate relative to the middle housing. In other words, the first rotating arm has a rotation center, and the rotation center of the first rotating arm is the second axis. The rotation center (the second axis) of the first rotating arm is a rotation center around which the first rotating arm rotates relative to the middle housing and may be understood as a straight line around which the first rotating arm can rotate relative to the middle housing in an angle range of 0° to 90°.

The first axis and the second axis are not collinear. In other words, the first axis and the second axis are staggered due to a distance difference. Based on this, when the first rotating arm and the first transmission arm rotate relative to the middle housing, the first rotating arm rotates earlier than the first transmission arm, and the first transmission arm rotates later than the first rotating arm.

Therefore, by using a position differential principle that the first axis and the second axis are staggered so that a position differential occurs during rotation of the first transmission arm and the first rotating arm, the first transmission arm and the first mounting bracket can slide relative to each other during rotation of the first transmission arm and the first rotating arm.

Based on the foregoing descriptions, it should be understood that the first transmission arm is rotatably connected to the middle housing and slidably connected to the first mounting bracket to form a connecting rod slider structure, and the first rotating arm is rotatably connected to the middle housing and rotatably connected to the first mounting bracket to form a connecting rod structure. Therefore, the first mounting bracket can be connected to the middle housing by using the connecting rod slider structure and the connecting rod structure. In this architecture, the folding apparatus has a few parts and a simple fitting relationship and fitting location, and constituent parts are easy to fabricate and assemble, thereby facilitating mass production. In addition, the first mounting bracket is further linked to the first housing, so that the folding apparatus has relatively good overall mechanism tensile resistance and mechanism extrusion resistance.

In addition, the folding apparatus controls moving tracks of the first mounting bracket and the first housing by using both the first transmission arm and the first rotating arm. Therefore, during folding of the first housing, the first mounting bracket can drive the first housing to move toward the middle housing; and during unfolding of the first housing, the first mounting bracket drives the first housing to move away from the middle housing. For example, the housing can rotate inward in a process in which the folding apparatus changes from the flattened state to a closed state, and the housing can rotate outward in a process in which the folding apparatus changes from the closed state to the flattened state, so that during unfolding or folding of the folding apparatus, a deformation movement of the flexible display can be implemented to reduce a risk of pulling or pressing against the flexible display, so as to protect the flexible display, improve reliability of the flexible display, and make the flexible display and an electronic device have a relatively long service life.

The first support plate is movably connected to a sliding structure of the first transmission arm, so that in a process in which the first housing and the second housing are folded or unfolded relative to each other, the first support plate and the sliding structure of the first transmission arm slide and rotate relative to each other. Therefore, the first support plate can be driven by the first transmission arm to move along with the first transmission arm when the first transmission arm and the first mounting bracket slide relative to each other.

Based on this, the first transmission arm can serve as an active driving structure of the first support plate, so that the first support plate moves along with the first transmission arm when the first transmission arm slides relative to the first mounting bracket. In other words, the first transmission arm can directly drive the first support plate to move, so that the first support plate can have sufficient thrust force to move stably and smoothly, thereby minimizing a possibility of unsmoothness or jamming during movement of the first support plate and achieving high reliability.

It should be understood that the first support plate can move along with the first transmission arm. This can achieve high control precision and small backlash during movement of the first support plate. In addition, a support requirement of the flexible display can be better met. Therefore, when the folding apparatus is in the flattened state, an intermediate state, or the closed state, the first support plate together with the middle housing can jointly provide strong support for a bending portion of the flexible display, so that the flexible display is not easily damaged under external force, to improve reliability of the flexible display and extend a service life of the flexible display and the electronic device.

In a possible implementation, the first transmission arm includes a sliding structure, the sliding structure of the first transmission arm includes a first sliding body, a peripheral side face of the first sliding body is concave inward to form a first concave region, the first support plate includes a first plate body and a first guiding structure that protrudes from the first plate body, the first guiding structure is connected to the first concave region, and the first guiding structure and the first sliding body can slide relative to each other.

Therefore, the first concave region can accommodate not only a first shaft, but also the first guiding structure of the first support plate, thereby facilitating connection between the first shaft and the first guiding structure, and reducing space occupied by a foldable mechanism, so that the folding apparatus and the electronic device in which the folding apparatus is used can be light and thin.

In addition, the first guiding structure and the first sliding body can slide relative to each other. Therefore, the first support plate can move along with the first transmission arm. For example, the first support plate can be driven by the first transmission arm, through sliding of the first transmission arm relative to the first mounting bracket, to rotate relative to the middle housing. Therefore, the first support plate always has sufficient driving force because it is driven by the first transmission arm, and can move smoothly during movement, so that the first support plate can move in place in a process in which the first housing and the second housing are folded or unfolded relative to each other, to better protect the flexible display.

In a possible implementation, a first track slot is provided on the first guiding structure, the sliding structure of the first transmission arm further includes a first shaft, one end of the first shaft is connected to one side of the first concave region, the first shaft passes through the first track slot, the other end of the first shaft is connected to the other side of the first concave region, and the first shaft can slide in the first track slot.

Therefore, the first shaft may be located substantially in the first concave region. Further, the first shaft may be connected to the first track slot of the first support plate. In other words, the first sliding body may be connected to the first support plate by using the first shaft. In other words, the first transmission arm may be connected to the first support plate by using the first shaft. Therefore, the first concave region can accommodate not only the first shaft, but also a part of a structure of the first support plate, thereby facilitating connection between the first shaft and the first sliding body and connection between the first shaft and the first support plate, and reducing space occupied by the foldable mechanism, so that the folding apparatus and the electronic device in which the folding apparatus is used can be light and thin.

In a possible implementation, the first track slot penetrates a front facet and a back facet of the first guiding structure, and the first track slot does not penetrate a peripheral side face of the first guiding structure.

Therefore, the first track slot can form an enclosed structure, and because of the closure property of the first track slot, the first shaft can reciprocally slide only in movement space limited by the first track slot, thereby limiting the first shaft, and effectively preventing the first shaft from accidentally detaching from the first track slot.

In a possible implementation, an extension path of the first track slot includes an arc shape or a straight line shape.

For example, the extension path of the first track slot is in the arc shape, so that the first track slot is in an arc shape. Therefore, by adjusting a radian of the arc shape of the first track slot, a moving track of the first support plate can be directly controlled, so that high control precision and small backlash can be achieved during movement of the first support plate, thereby avoiding pulling or pressing against the flexible display when the first support plate moves along with the first transmission arm to a specific angle, and effectively reducing screen stress of the flexible display. In addition, a moving track of the flexible display can be indirectly adjusted, so that the radian of the arc shape of the first track slot can better adapt to the moving track of the flexible display, and the moving track of the flexible display is adjustable.

Alternatively, the extension path of the first track slot is in the straight line shape, so that the first track slot is in a linear shape.

Therefore, the extension path of the first track slot may be designed, so that in a process in which the first housing and the second housing are folded or unfolded relative to each other, an intermediate moving process, namely, a moving track, of the first support plate can be designed, and a moving track of the flexible display can be controlled in the process, thereby avoiding excessive local stress of the flexible display, and effectively reducing screen stress of the flexible display. It should be understood that the extension path of the first track slot may not be limited to the foregoing arc shape or straight line shape, but may be alternatively one or a combination of a curved shape, the straight line shape, and a broken line shape. This is not limited in this embodiment.

In a possible implementation, an extension path of the first track slot is adjustable. In other words, a track of the first track slot can be adjusted.

In a possible implementation, a first sliding slot is provided on the first mounting bracket, a side wall of the first sliding slot has concave guiding space, a first flange is disposed on each of a front facet and a back facet of the first sliding body, the first flange is connected to the guiding space of the first sliding slot, and the first flange can slide relative to the first sliding slot.

Therefore, the first sliding body and the first sliding slot can form a slipper mechanism, so that a relative sliding action between the first sliding body and the first sliding slot is implemented more easily and control precision is higher through fitting between the first flange of the first sliding body and the guiding space of the first sliding slot.

In a possible implementation, a first rotating slot is provided on the first mounting bracket, the first rotating slot is in an arc shape, the first support plate further includes a first rotating structure disposed on the first plate body, the first rotating structure and the first guiding structure are located on a same side of the first plate body, and the first rotating structure is in an arc shape and is mounted in the first rotating slot.

The first support plate is rotatably connected to the first mounting bracket through fitting between the first rotating structure and the first rotating slot.

Therefore, the first support plate and the first mounting bracket are rotatably connected by using a virtual shaft through relative movement between the first rotating structure and the first rotating slot. In this architecture, a rotatable connection structure is simple, and small space is occupied, so that the folding apparatus and the electronic device can be made light and thin more easily.

In a possible implementation, the first rotating structure includes a first baffle plate and a first arc-shaped arm that protrude from the first plate body, the first arc-shaped arm is connected to one side of the first baffle plate, the first arc-shaped arm is further connected to the first rotating slot and can slide in the first rotating slot, and the first baffle plate is configured to support the first arc-shaped arm.

For example, the first arc-shaped arm may be in a crescent shape. The first baffle plate is configured to support the first arc-shaped arm, to improve strength of the first rotating structure, and avoid failure of the foldable mechanism due to breaking, damage, or the like of the first arc-shaped arm during rotation.

For example, the first baffle plate and the first arc-shaped arm may be integrated, and the integrated first rotating structure has a few assembly steps, thereby helping reduce production time and costs.

It can be understood that the first arc-shaped arm can rotate in the first rotating slot when the first support plate is driven by the first transmission arm to move along with the first transmission arm. That the first arc-shaped arm can rotate in the first rotating slot may be understood as that the first arc-shaped arm reciprocally slides in the first rotating slot. For example, in the first rotating slot, the first arc-shaped arm can slide from one end of the first rotating slot to the other end of the first rotating slot, and then slide from the other end of the first rotating slot back to the one end of the first rotating slot, and repeat this process. In other words, the first arc-shaped arm is rotatably connected to the first rotating slot.

Therefore, when the first transmission arm slides relative to the first mounting bracket, the first transmission arm can drive, through fitting between the first arc-shaped arm and the first rotating slot, the first support plate to rotate relative to the middle housing. In other words, the first support plate can rotate along with the first transmission arm during sliding of the first transmission arm.

In a possible implementation, a rotation center of the first rotating structure is located at a neutral layer of the flexible display.

In a possible implementation, the folding apparatus further includes a second support plate and a second housing, the first support plate and the second support plate are symmetrically distributed on two sides of the middle housing, and the second housing and the first housing are symmetrically distributed on two sides of the middle housing.

Therefore, the first housing, the first support plate, the middle housing, the second support plate, and the second housing are sequentially arranged in an extension direction of the flexible display, so that the first housing, the first support plate, the middle housing, the second support plate, and the second housing can jointly support the flexible display in the folded state, an intermediate state, or the closed state of the folding apparatus, thereby achieving high reliability.

It should be noted that the flattened state may be understood as that the second housing and the second support plate do not rotate relative to the middle housing, so that the second housing, the second support plate, and the middle housing are flush with each other to jointly support the flexible display. For example, in the flattened state, the second housing, the second support plate, and the middle housing may be arranged in a straight line shape. The folded state may be understood as that the second housing and the second support plate rotate relative to the middle housing, so that the second housing and the second support plate are disposed at an included angle with the middle housing to form accommodation space for accommodating the flexible display. For example, in the folded state, the second housing, the second support plate, and the middle housing may be arranged in an arc shape.

In a possible implementation, the folding apparatus further includes a second mounting bracket, a second transmission arm, and a second rotating arm.

The second mounting bracket is fixed to the second housing. The second transmission arm is rotatably connected to the middle housing, and a rotation center is a third axis. The second transmission arm is slidably connected to the second mounting bracket, and the second transmission arm is slidably connected to the second support plate.

The second rotating arm is rotatably connected to the middle housing, and a rotation center is a fourth axis. The second rotating arm is rotatably connected to the second mounting bracket. The fourth axis and the third axis are not collinear.

The second support plate is rotatably connected to the second mounting bracket, and the second support plate can be driven by the second transmission arm, through sliding of the second transmission arm relative to the second mounting bracket, to rotate relative to the middle housing, so that the second housing, the second support plate, and the middle housing switch between a flattened state and a folded state.

In a possible implementation, when the first housing and the second housing are folded relative to each other to the closed state, the first support plate, the middle housing, and the second support plate jointly form accommodation space used to accommodate the flexible display; or when the first housing and the second housing are unfolded relative to each other to an open state, the first support plate, the middle housing, and the second support plate are flush with each other to support the flexible display.

Therefore, the first support plate, the middle housing, and the second support plate can jointly provide strong support for the flexible display in various forms, so that the flexible display is not easily dented under external force. This helps reduce a risk of damaging the display, and improves reliability of the flexible display, so that the flexible display and the electronic device have a relatively long service life.

In a possible implementation, the second axis is closer than the first axis to a periphery, of the middle housing, that is close to the first housing; and the fourth axis is closer than the third axis to a periphery of the middle housing, that is close to the second housing.

In a possible implementation, the folding apparatus further includes a first rotation assistance assembly, the first rotation assistance assembly includes a second shaft and a first elastic piece, the first rotating arm is rotatably connected to the first mounting bracket by using the second shaft, and the first elastic piece is sleeved on the second shaft and is elastically sandwiched between the first mounting bracket and the first support plate.

It can be understood that a movement gap is reserved at a joint of parts in the foldable mechanism that have a movement fitting relationship. The movement gap causes an angle deviation between the first support plate and the second support plate in a process in which the first support plate and the second support plate rotate relative to the middle housing. As a result, when the folding apparatus is in the closed state, an included angle between the first support plate and the second support plate cannot reach an angle required by a design. For example, the included angle between the first support plate and the second support plate may be smaller than the angle required by the design. As a result, the flexible display is pressed against, local stress of the flexible display increases, and the flexible display is more easily damaged. Therefore, by adding the first rotation assistance assembly, a possibility that the included angle between the first support plate and the second support plate cannot reach the angle required by the design due to the movement gap between the parts can be minimized, and the included angle between the first support plate and the second support plate can be made at an optimal angle required by the design.

In a possible implementation, the first elastic piece is a torsion spring, the torsion spring has two free ends, one free end of the torsion spring is connected to the first mounting bracket, and the other free end of the torsion spring is connected to the first support plate.

For example, the first elastic piece is a torsion spring, the torsion spring has two free ends, one free end of the torsion spring is connected to the first mounting bracket and is fixed relative to a location of the first mounting bracket, and the other free end of the torsion spring is connected to the first support plate and is fixed relative to a location of the first support plate. In other words, one free end of the torsion spring is fixedly connected to the first mounting bracket, and the other free end of the torsion spring is fixedly connected to the first support plate. For example, the free end of the torsion spring that is fixed to the first mounting bracket may be fixed to the first mounting bracket through bonding, clamping, or the like, and the free end of the torsion spring that is fixed to the first support plate may be assembled into a corresponding locking structure on the first support plate to be fixed to the first support plate. However, it should be understood that a manner in which the torsion spring is fixed to the first mounting bracket and the first support plate may be designed according to an actual requirement. This is not limited in this embodiment.

Therefore, torsion of the torsion spring can act on the first support plate, thereby exerting tension on the first support plate in a direction toward the first mounting bracket. In the closed state of the folding apparatus, the tension can eliminate the angle deviation caused by the movement gap between the parts, so that movement of the first support plate reaches a designed angle, the included angle between the first support plate and the second support plate meets a design requirement, and a simple structure and superb performance are achieved.

According to a second aspect, the embodiments provide an electronic device. The electronic device includes a flexible display and the foregoing folding apparatus. The flexible display is fixed to the folding apparatus.

DETAILED DESCRIPTION OF THE EMBODIMENTS

The following describes specific implementations of the embodiments with reference to accompanying drawings.

Figure 1:
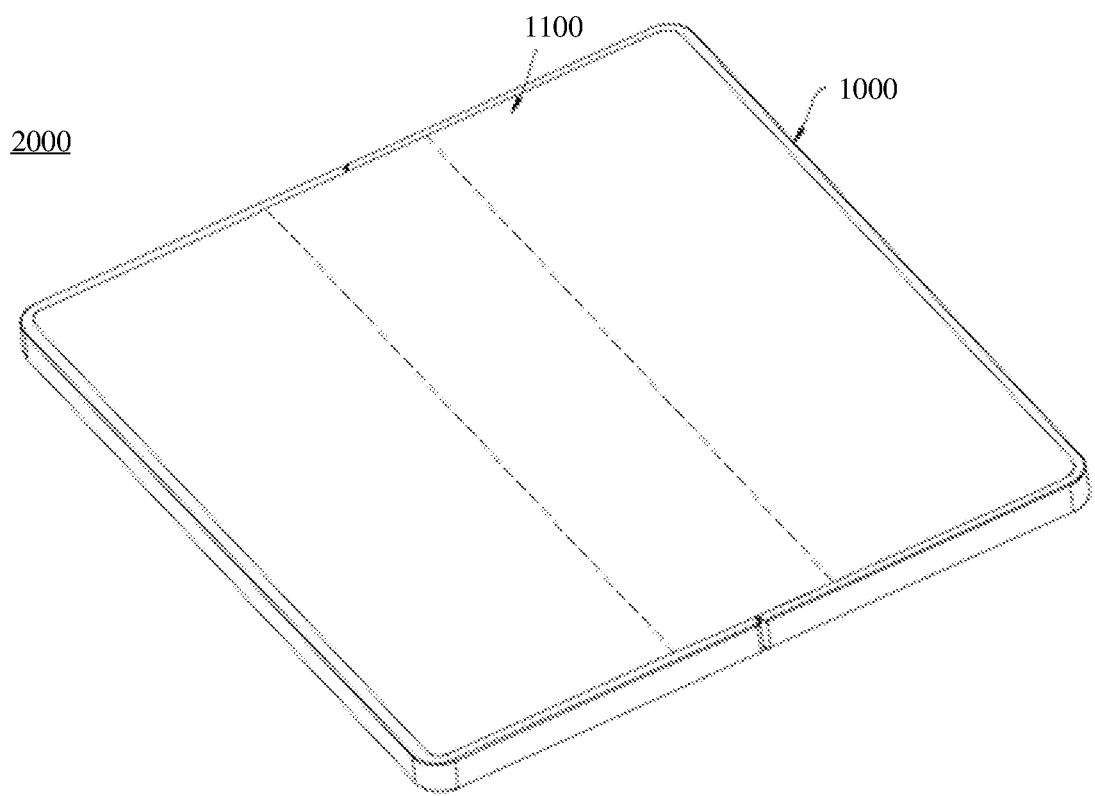
FIG. 1 is a schematic structural diagram of an electronic device according to an embodiment.

Referring to FIG. 1, an embodiment provides an electronic device 2000. The electronic device 2000 is foldable, and the electronic device 2000 may be, but is not limited to a mobile phone, a tablet computer, an e-reader, a notebook computer, a vehicle-mounted device, or other devices. In this embodiment, for ease of understanding, an example in which the electronic device 2000 is a mobile phone that has a wide range of users and abundant application scenarios is used for description, but this does not constitute a limitation.

Figure 2:
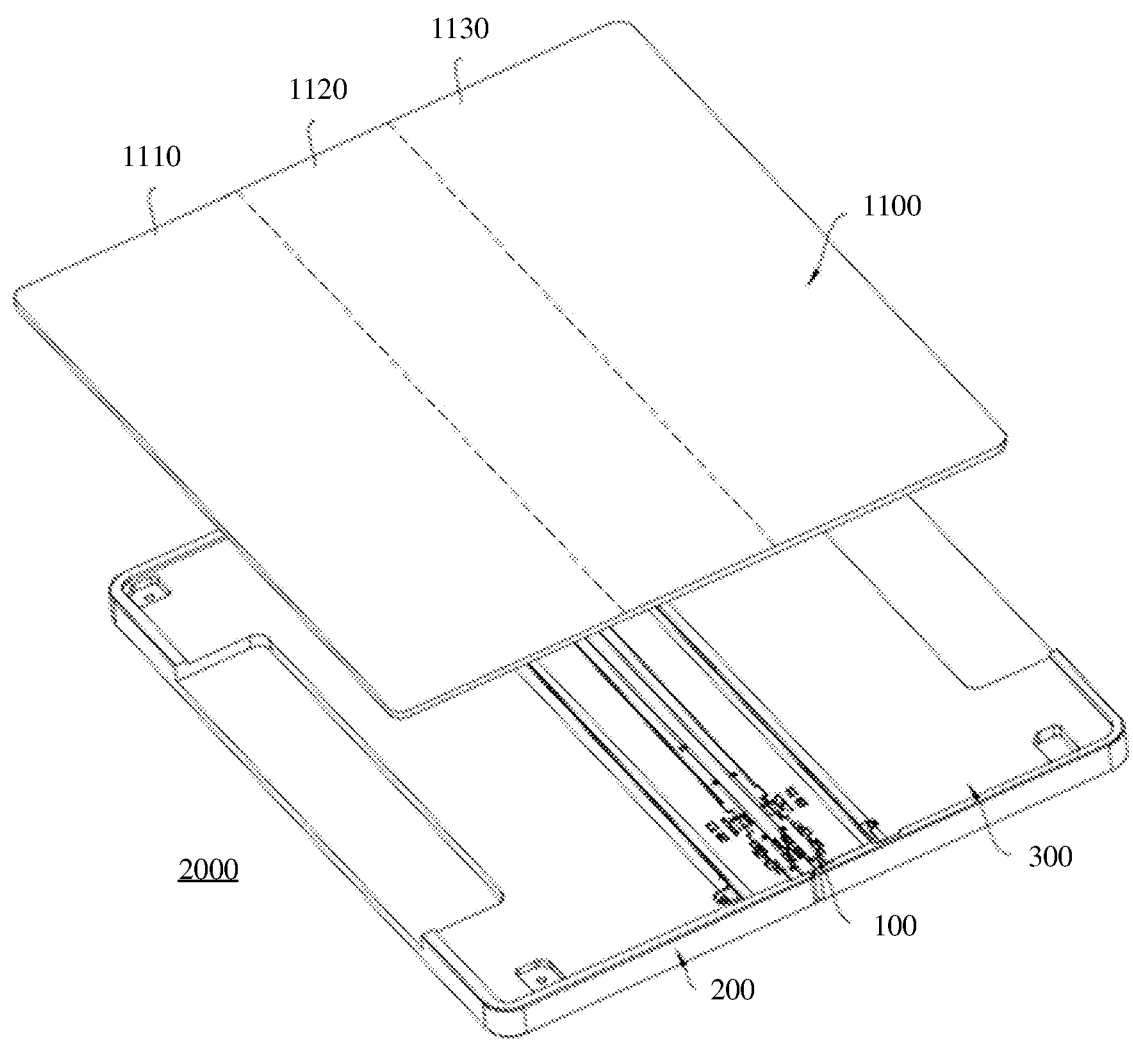
FIG. 2 is a schematic exploded view of an electronic device shown in FIG. 1.

Referring to FIG. 1 and FIG. 2, the electronic device 2000 includes a folding apparatus 1000 and a flexible display 1100. The folding apparatus 1000 may be unfolded to a flattened state, or may be folded to a closed state, or may be in an intermediate state between the flattened state and the closed state, so that the electronic device 2000 is foldable. The flexible display 1100 is fixed to the folding apparatus 1000 and can be configured to display information and provide an interaction interface for a user. The flexible display 1100 may be unfolded as the folding apparatus 1000 is unfolded or folded as the folding apparatus 1000 is folded. For example, the flexible display 1100 may be fixed to the folding apparatus 1000 through glue dispensing.

It should be noted that FIG. 1 and FIG. 2 are merely intended to schematically describe a connection relationship between the folding apparatus 1000 and the flexible display 1100, but not to limit a connection location, a specific structure, or a quantity of devices. The structure shown in this embodiment does not constitute a limitation on the electronic device 2000. In some other embodiments, the electronic device 2000 may include more or fewer components than those shown in the figure, or some components may be combined, or some components may be split, or there may be a different component layout. The components shown in the figure may be implemented by hardware, software, or a combination of software and hardware.

Referring to FIG. 2 to FIG. 5, the folding apparatus 1000 includes a foldable mechanism 100, a first housing 200, and a second housing 300. The foldable mechanism 100 is connected between the first housing 200 and the second housing 300 and can be deformed so that the first housing 200 and the second housing 300 are folded or unfolded relative to each other. In other words, the foldable mechanism 100 can enable the first housing 200 and the second housing 300 to move relative to each other.

For example, a first mounting slot 210 is provided on a side, of the first housing 200, that is close to the foldable mechanism 100; a second mounting slot 310 is provided on a side, of the second housing 300, that is close to the foldable mechanism 100; and the first mounting slot 210 and the second mounting slot 310 encircle mounting space that can accommodate the foldable mechanism 100. The foldable mechanism 100 is accommodated in the mounting space and is connected to both the first housing 200 and the second housing 300.

In this embodiment, the first housing 200 and the second housing 300 can be unfolded relative to each other to a flattened state, so that the electronic device 2000 is in a flattened state. For example, when the first housing 200 and the second housing 300 are in the flattened state, an included angle between the first housing 200 and the second housing 300 may be set to approximately 180° (a slight deviation is allowed, for example, 175°, 178°, or 185°). Alternatively, the first housing 200 and the second housing 300 can be folded relative to each other to a closed state, so that the electronic device 2000 is in a closed state. For example, when the first housing 200 and the second housing 300 are in the closed state, the first housing 200 and the second housing 300 can be fully closed to be parallel to each other (a slight deviation is also allowed). Alternatively, the first housing 200 and the second housing 300 can rotate relative to each other to be close to each other (folded) or away from each other (unfolded) to an intermediate state, so that the electronic device 2000 is in an intermediate state. The intermediate state may be any state between the flattened state and the closed state. For example, when the first housing 200 and the second housing 300 are in the intermediate state, an included angle between the first housing 200 and the second housing 300 may be 135°, 90°, or 45°.

Therefore, the electronic device 2000 may switch between the flattened state and the closed state under driving by the foldable mechanism 100 and be kept in the flattened state or the closed state.

When the electronic device 2000 is in the flattened state, an area of the electronic device 2000 is relatively large, and the flexible display 1100 is flattened to a flattened state. In this case, the flexible display 1100 can perform full-screen display. Therefore, the electronic device 2000 has a relatively large display area, and can present a large-screen display effect, thereby improving user experience. When the electronic device 2000 is in a folded state, an area of the electronic device 2000 is relatively small, so that a user can easily store and carry the electronic device 2000. For example, the electronic device 2000 may implement inward folding of the flexible display 1100 by using the folding apparatus 1000. In this case, the flexible display 1100 may be sandwiched between the first housing 200 and the second housing 300, that is, the flexible display 1100 may be located inside the folding apparatus 1000 and wrapped by the folding apparatus 1000. Alternatively, the electronic device 2000 may implement outward folding of the flexible display 1100 by using the folding apparatus 1000. In this case, the flexible display 1100 may be exposed outside as an exterior structure of the electronic device 2000, that is, the flexible display 1100 may be located outside the folding apparatus 1000 and wrap the folding apparatus 1000.

For example, still referring to FIG. 2, the flexible display 1100 includes a first non-bending portion 1110, a bending portion 1120, and a second non-bending portion 1130 that are sequentially connected. The first non-bending portion 1110 is fixed to the first housing 200, and the second non-bending portion 1130 is fixed to the second housing 300. In a process in which the first housing 200 and the second housing 300 are folded or unfolded relative to each other, the bending portion 1120 is deformed. For example, the flexible display 1100 may be an organic light-emitting diode (OLED) display, an active-matrix organic light-emitting diode (AMOLED) display, a mini organic light-emitting diode display, a micro light-emitting diode display, a micro organic light-emitting diode (micro organic light-emitting diode) display, or a quantum dot light-emitting diode (QLED) display.

In this embodiment, the foldable mechanism 100 of the folding apparatus 1000 in the electronic device 2000 is optimized, so that the foldable mechanism 100 has an active driving structure for actively driving a rotatable support plate to move. The rotatable support plate can obtain sufficient driving force during movement to move smoothly and stably, thereby achieving high reliability and helping improve user experience. Details are described below.

Figure 3:
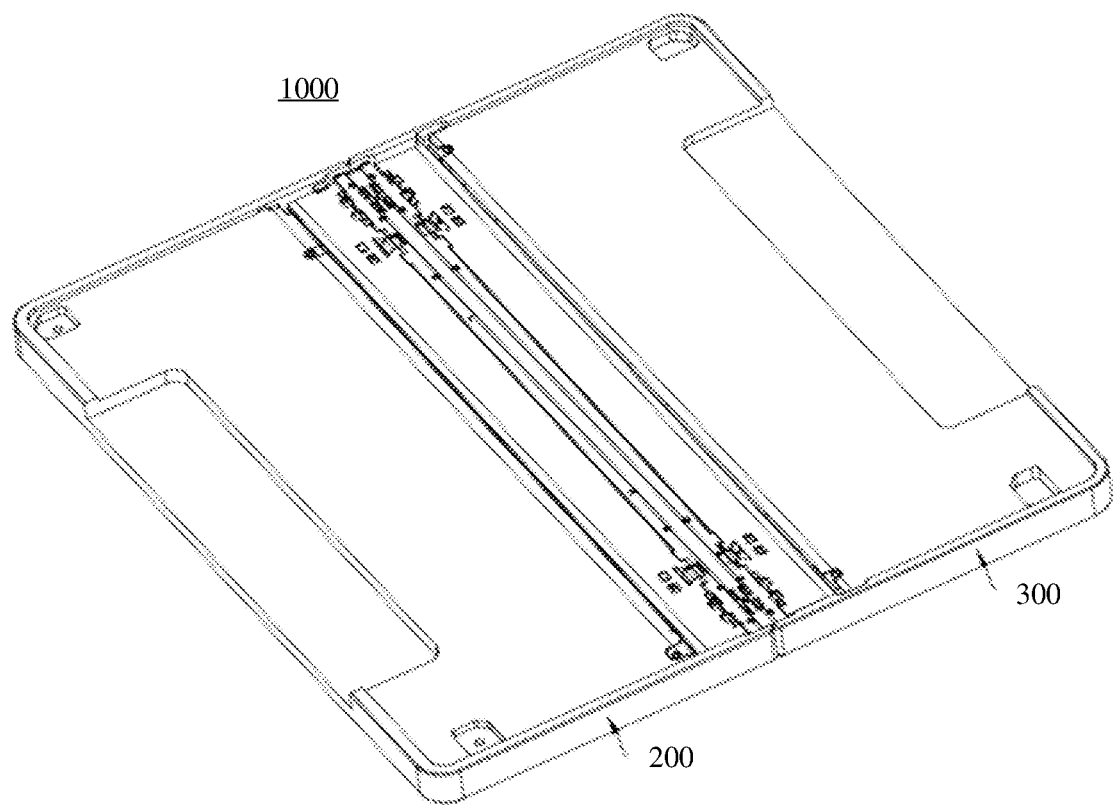
FIG. 3 is a schematic structural diagram of a folding apparatus according to an embodiment.
Figure 4:
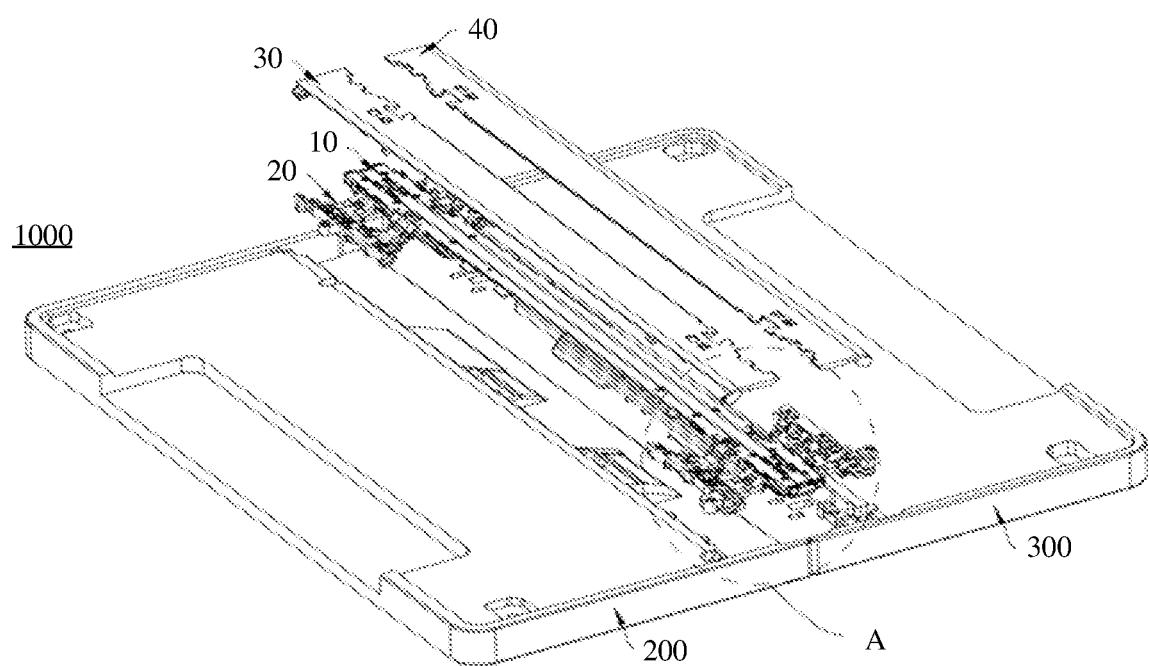
FIG. 4 is a schematic exploded view of a folding apparatus shown in FIG. 3.
Figure 5:
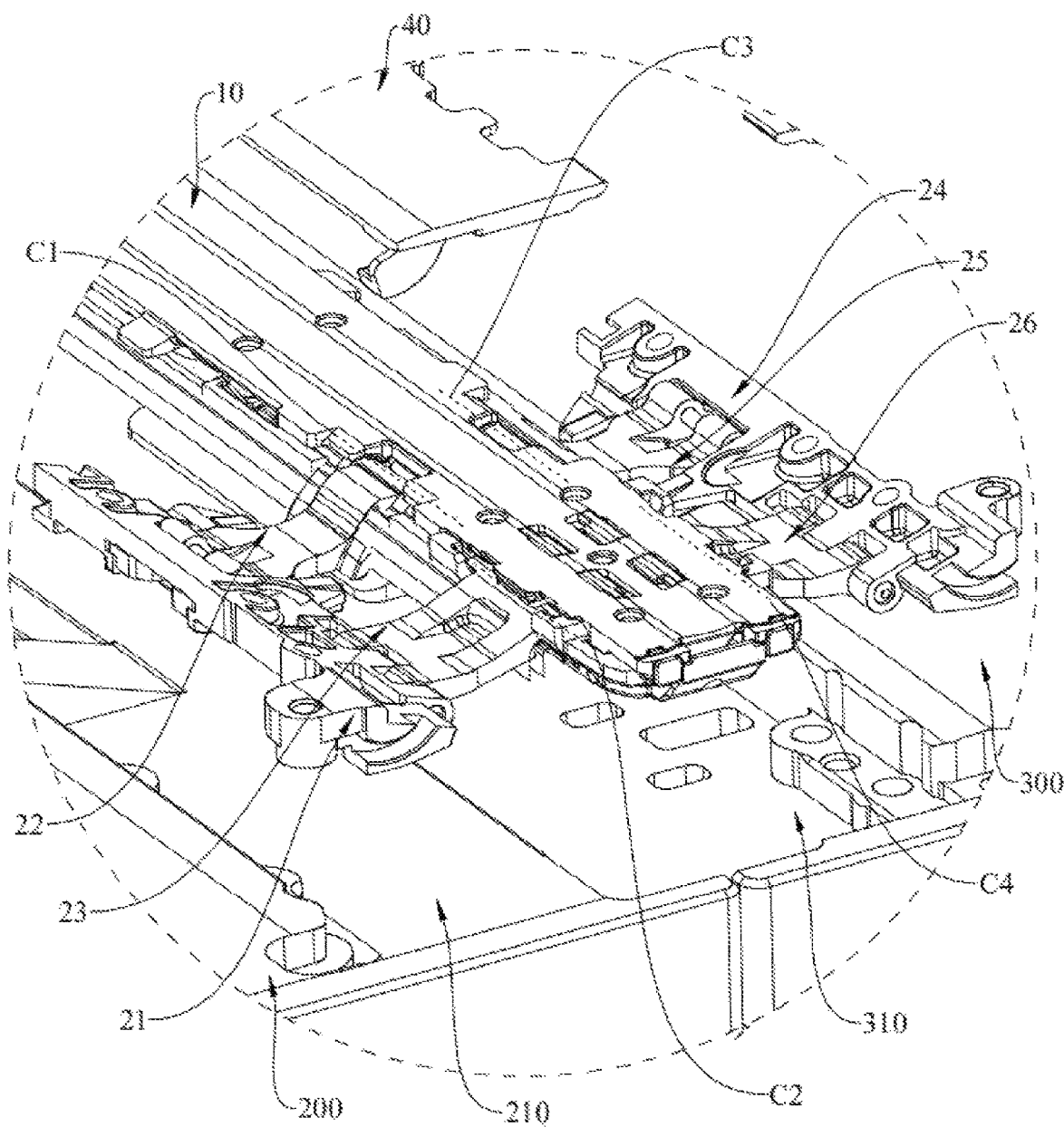
FIG. 5 is a schematic enlarged view of a region A of a folding apparatus shown in FIG. 4.

Referring to FIG. 3, FIG. 4, and FIG. 5, the foldable mechanism 100 includes a middle housing 10, a movable connecting assembly 20, a first support plate 30, and a second support plate 40.

It can be understood that the first housing 200, the first support plate 30, the middle housing 10, the second support plate 40, and the second housing 300 are sequentially arranged in an extension direction of the flexible display. For example, the first support plate 30 and the second support plate 40 are symmetrically distributed on two sides of the middle housing 10, and the first housing 200 and the second housing 300 are symmetrically distributed on two sides of the middle housing 10. However, it should be understood that the symmetrical distribution means symmetrical distribution in locations, but does not mean that the two support plates or the two housings have an identical shape or structure. The two support plates or the two housings may have a same structure or different structures.

Therefore, the first housing 200, the first support plate 30, the middle housing 10, the second support plate 40, and the second housing 300 can jointly support the flexible display 1100 in the folded state, the intermediate state, or the closed state of the folding apparatus 1000, thereby achieving high reliability.

The middle housing 10 can remain in a stationary state in a process in which the first housing 200 and the second housing 300 are folded or unfolded relative to each other. In other words, in the process in which the first housing 200 and the second housing 300 are folded or unfolded relative to each other, a location of the middle housing 10 can remain unchanged, that is, the middle housing 10 is relatively stationary. However, both the first housing 200 and the second housing 300 can rotate relative to the middle housing 10, and when the first housing 200 and the second housing 300 are folded relative to each other to the closed state, the middle housing 10 is located between the first housing 200 and the second housing 300.

The movable connecting assembly 20 connects the first housing 200, the middle housing 10, and the second housing 300. For example, there are two movable connecting assemblies 20, and the two movable connecting assemblies 20 are arranged at an interval in a length direction of the middle housing 10 (namely, a width direction of the electronic device 2000). The two movable connecting assemblies 20 may be separately connected to the top and the bottom of the middle housing 10. Alternatively, there is one movable connecting assembly 20, and the movable connecting assembly 20 may be connected to a middle part of the middle housing 10 and is connected to a middle part of the first housing 200 and a middle part of the second housing 300. It should be understood that there may be a plurality of combinations and variations for a structure of the foldable mechanism 100. This is not limited in this embodiment.

The first support plate 30 is located on a side, of the middle housing 10, that faces the first housing 200, and the first support plate 30 is connected to the movable connecting assembly 20. The second support plate 40 is located on a side, of the middle housing 10, that faces the second housing 300, and the second support plate 40 is connected to the movable connecting assembly 20. Therefore, the first support plate 30 and the second support plate 40 may be located on a same side of the two movable connecting assemblies 20 and both connected to the two movable connecting assemblies 20 and can move along with the two movable connecting assemblies 20, to support or accommodate the flexible display 1100 through fitting with the first housing 200, the middle housing 10, and the second housing 300.

Figure 6:
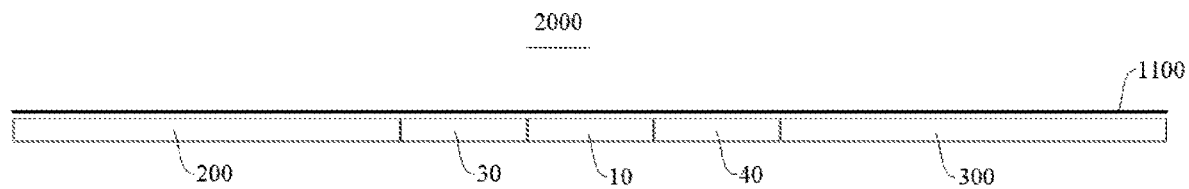
FIG. 6 is a simplified schematic structural diagram of an electronic device in a flattened state according to an embodiment.
Figure 7:
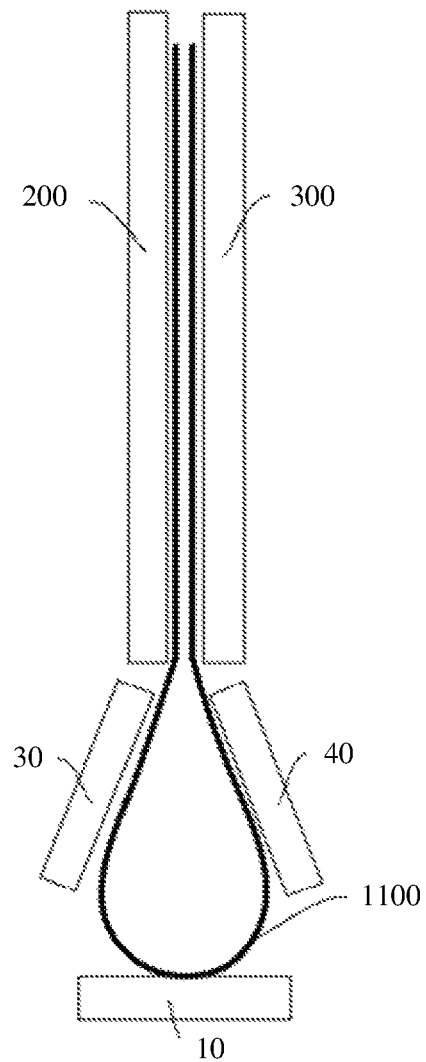
FIG. 7 is a simplified schematic structural diagram of an electronic device in a folded state according to an embodiment.

Referring to FIG. 6 and FIG. 7, for example, when the electronic device 2000 is in the flattened state, the first housing 200, the first support plate 30, the middle housing 10, the second support plate 40, and the second housing 300 are flush with each other to jointly support the flexible display 1100, so that the flexible display 1100 is more flat and is not easily damaged by touching by external force, thereby improving reliability of the flexible display 1100. When the electronic device 2000 is in the closed state, the first housing 200 and the second housing 300 can be completely closed to be parallel to each other, so that the first housing 200, the first support plate 30, the middle housing 10, the second support plate 40, and the second housing 300 jointly form accommodation space for accommodating the flexible display 1100, to adapt to an ideal closed form of the flexible display 1100, and better support the flexible display 1100 in the closed form. It should be understood that the flexible display 1100 may be attached to the first housing 200, the first support plate 30, the middle housing 10, the second support plate 40, and the second housing 300.

The following describes in detail a specific structure and a connection relationship of the movable connecting assembly 20.

Figure 8:
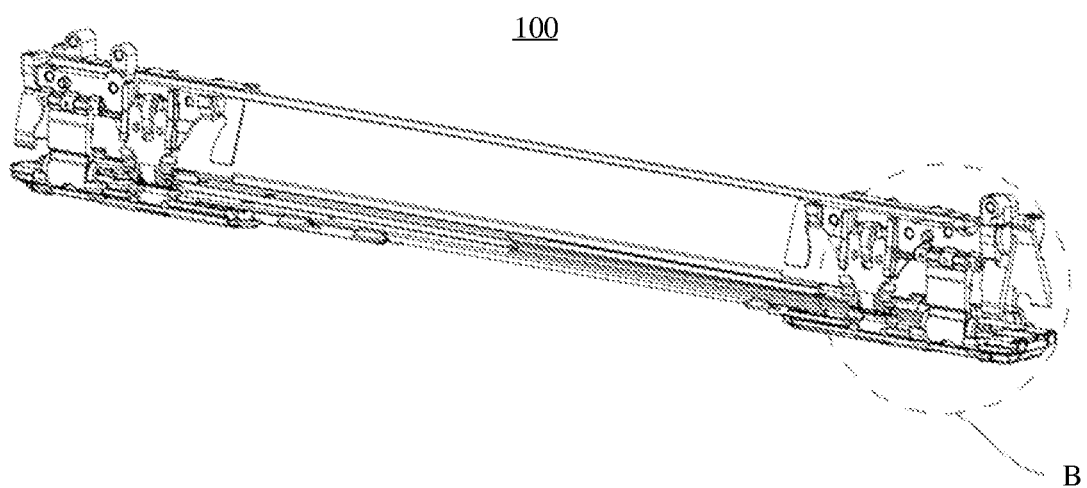
FIG. 8 is a schematic structural diagram of a foldable mechanism of a folding apparatus according to an embodiment.
Figure 9:
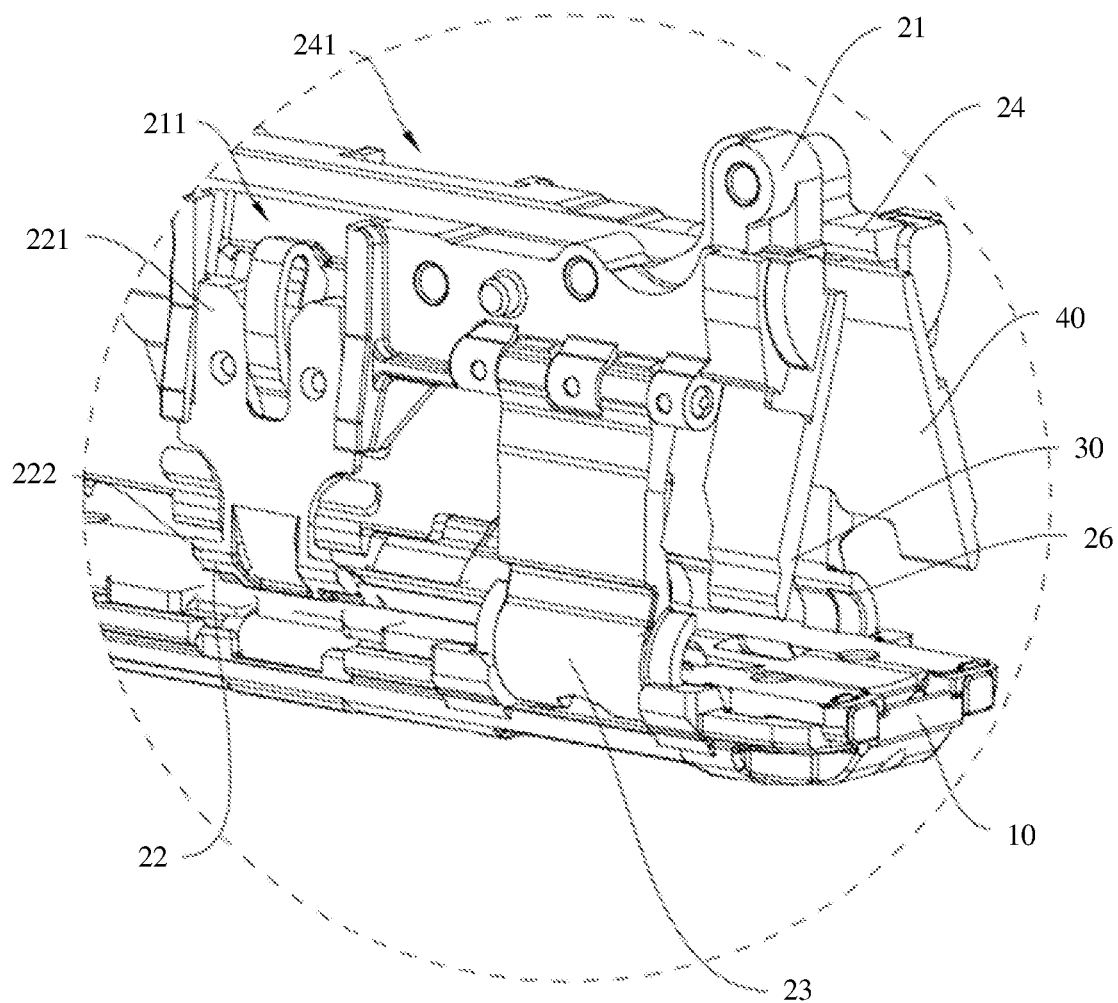
FIG. 9 is a schematic enlarged view of a region B of a folding apparatus shown in FIG. 8.

Referring to FIG. 5, FIG. 8, and FIG. 9, the movable connecting assembly 20 includes a first mounting bracket 21, a first transmission arm 22, a first rotating arm 23, a second mounting bracket 24, a second transmission arm 25, and a second rotating arm 26.

A plurality of fastening holes may be provided on the first mounting bracket 21, and the first mounting bracket 21 may be fixed to the first housing 200 by using a one-to-one correspondence between a plurality of fasteners and the plurality of fastening holes. In other words, the foldable mechanism 100 is connected to the first housing 200 by using the first mounting bracket 21.

Figure 10:
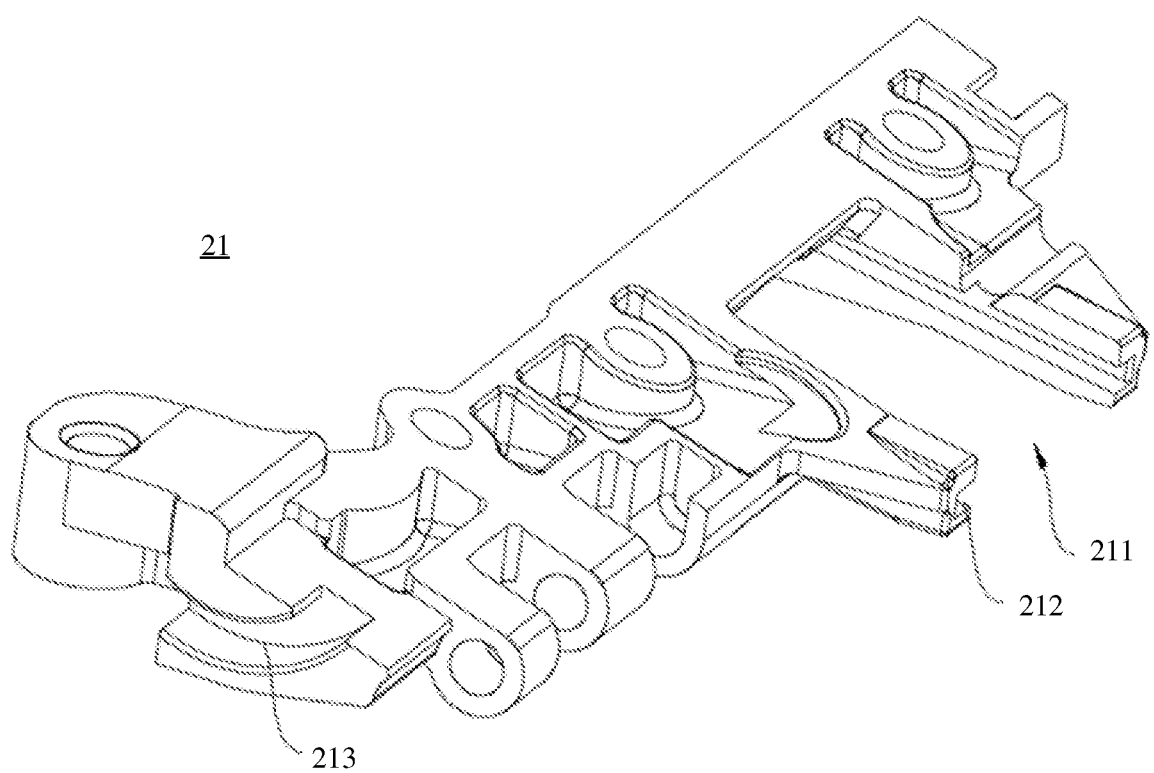
FIG. 10 is a schematic structural diagram of a first mounting bracket of a foldable mechanism shown in FIG. 8.

Referring to FIG. 5, FIG. 9, and FIG. 10, a first sliding slot 211 may be further provided on the first mounting bracket 21, and the first sliding slot 211 may be configured to implement a slidable connection to a corresponding structure on the first transmission arm 22. For example, the first sliding slot 211 has two side walls disposed opposite to each other, and the two side walls disposed opposite to each other are concave to jointly form guiding space 212 of the first sliding slot 211. For example, the side walls of the first sliding slot 211 may have the concave guiding space 212, to guide a sliding direction of the corresponding structure on the first transmission arm 22, so that a relative sliding action between the first mounting bracket 21 and the first transmission arm 22 is implemented more easily, and control precision is higher.

A first rotating slot 213 is provided at an end of the first mounting bracket 21. The first rotating slot 213 is in an arc shape. The first rotating slot 213 can implement rotatable fitting with a corresponding structure on the first support plate 30, to form a rotatable connection between the first mounting bracket 21 and the first support plate 30 by using a virtual shaft, thereby ensuring that the corresponding structure on the first transmission arm 22 does not move during rotation and ensuring stability when the foldable mechanism 100 is opened or closed.

It can be understood that the first mounting bracket 21 can rotate relative to the middle housing 10, and the first mounting bracket 21 is further fixed to the first housing 200. Therefore, movement of the first mounting bracket 21 can drive the first housing 200 to move. For example, when the first mounting bracket 21 rotates relative to the middle housing 10, the first housing 200 is driven to rotate relative to the middle housing 10 along with the first mounting bracket 21.

Figure 11:
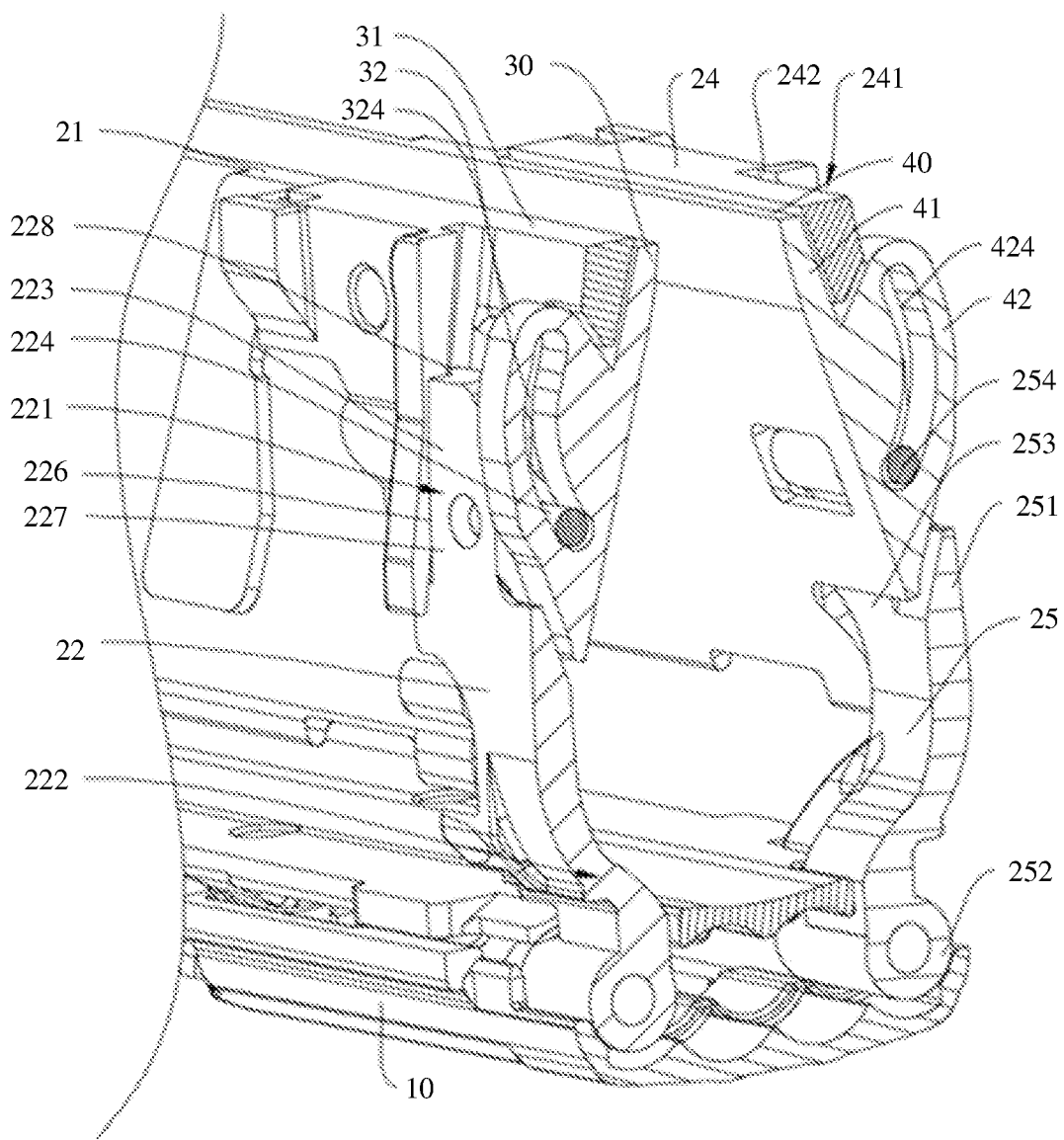
FIG. 11 is a schematic cross-sectional view of a foldable mechanism shown in FIG. 8 in a folded state.
Figure 12:
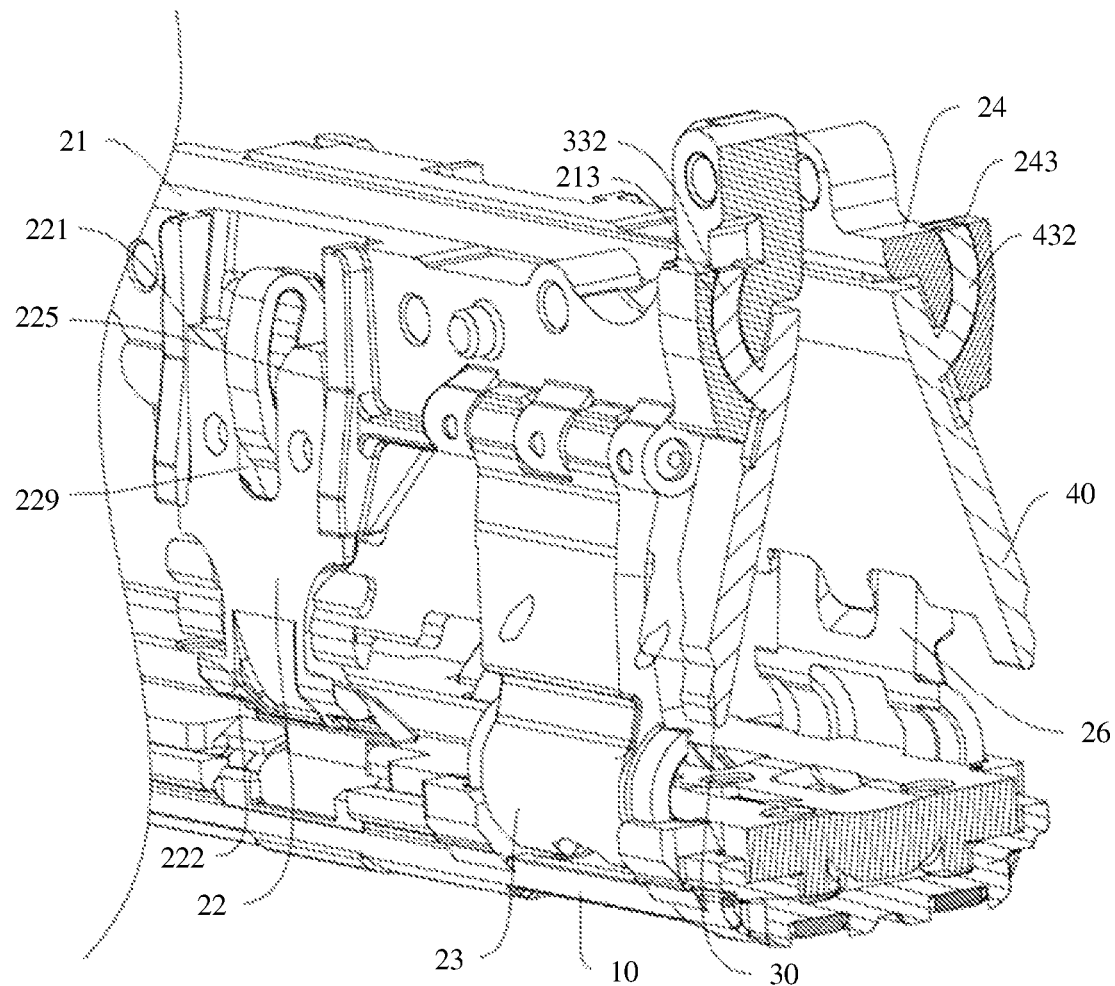
FIG. 12 is another schematic cross-sectional view of a foldable mechanism shown in FIG. 8 in a folded state.

Referring to FIG. 5, FIG. 11, and FIG. 12, a plurality of fastening holes may be provided on the second mounting bracket 24, and the second mounting bracket 24 may be fixed to the second housing 300 by using a one-to-one correspondence between a plurality of fasteners and the plurality of fastening holes. In other words, the foldable mechanism 100 is connected to the second housing 300 by using the second mounting bracket 24.

A second sliding slot 241 may be further provided on the second mounting bracket 24, and the second sliding slot 241 may be configured to implement a slidable connection to a corresponding structure on the second transmission arm 25. For example, the second sliding slot 241 has two side walls disposed opposite to each other, and the two side walls disposed opposite to each other are concave to jointly form guiding space 242 of the second sliding slot 241. For example, the side walls of the second sliding slot 241 may have the concave guiding space 242, to guide a sliding direction of the corresponding structure on the second transmission arm 25, so that a relative sliding action between the second mounting bracket 24 and the second transmission arm 25 is implemented more easily, and control precision is higher.

A second rotating slot 243 is provided at an end of the second mounting bracket 24. The second rotating slot 243 is in an arc shape. The second rotating slot 243 can implement rotatable fitting with a corresponding structure on the second support plate 40, to form a rotatable connection between the second mounting bracket 24 and the second support plate 40 by using a virtual shaft, thereby ensuring that the corresponding structure on the second transmission arm 25 does not move during rotation and ensuring stability when the foldable mechanism 100 is opened or closed.

It can be understood that the second mounting bracket 24 can rotate relative to the middle housing 10, and the second mounting bracket 24 is further fixed to the second housing 300. Therefore, movement of the second mounting bracket 24 can drive the second housing 300 to move. For example, when the second mounting bracket 24 rotates relative to the middle housing 10, the second housing 300 is driven to rotate relative to the middle housing 10 along with the second mounting bracket 24.

Based on the foregoing descriptions, when both the first mounting bracket 21 and the second mounting bracket 24 rotate relative to the middle housing 10 to be close to or away from each other, the first housing 200 can be driven by the first mounting bracket 21 to rotate relative to the middle housing 10, and the second housing 300 can be driven by the second mounting bracket 24 to rotate relative to the middle housing 10, so that the first housing 200 and the second housing 300 are folded or unfolded relative to each other.

Still referring to FIG. 5, in this embodiment, the first mounting bracket 21 can be rotatably connected to the middle housing 10 by using the first rotating arm 23. For example, one end of the first rotating arm 23 is connected to the first mounting bracket 21, and the end of the first rotating arm 23 can rotate relative to the first mounting bracket 21; and the other end of the first rotating arm 23 is connected to the middle housing 10, and the other end of the first rotating arm 23 can rotate relative to the middle housing 10. In other words, one end of the first rotating arm 23 is rotatably connected to the first mounting bracket 21, and the other end of the first rotating arm 23 is rotatably connected to the middle housing 10.

For example, one end of the first rotating arm 23 may be rotatably connected to the first mounting bracket 21 by using a real shaft. An arc-shaped arm may be disposed at the other end of the first rotating arm 23, and an arc-shaped slot may be provided on the middle housing 10. The arc-shaped arm is mounted in the arc-shaped slot. The first rotating arm 23 and the middle housing 10 are rotatably connected by using a virtual shaft through relative movement between the arc-shaped arm and the arc-shaped slot. Alternatively, the first rotating arm 23 and the middle housing 10 may be rotatably connected by using a real shaft. This is not limited in this embodiment.

Figure 13:
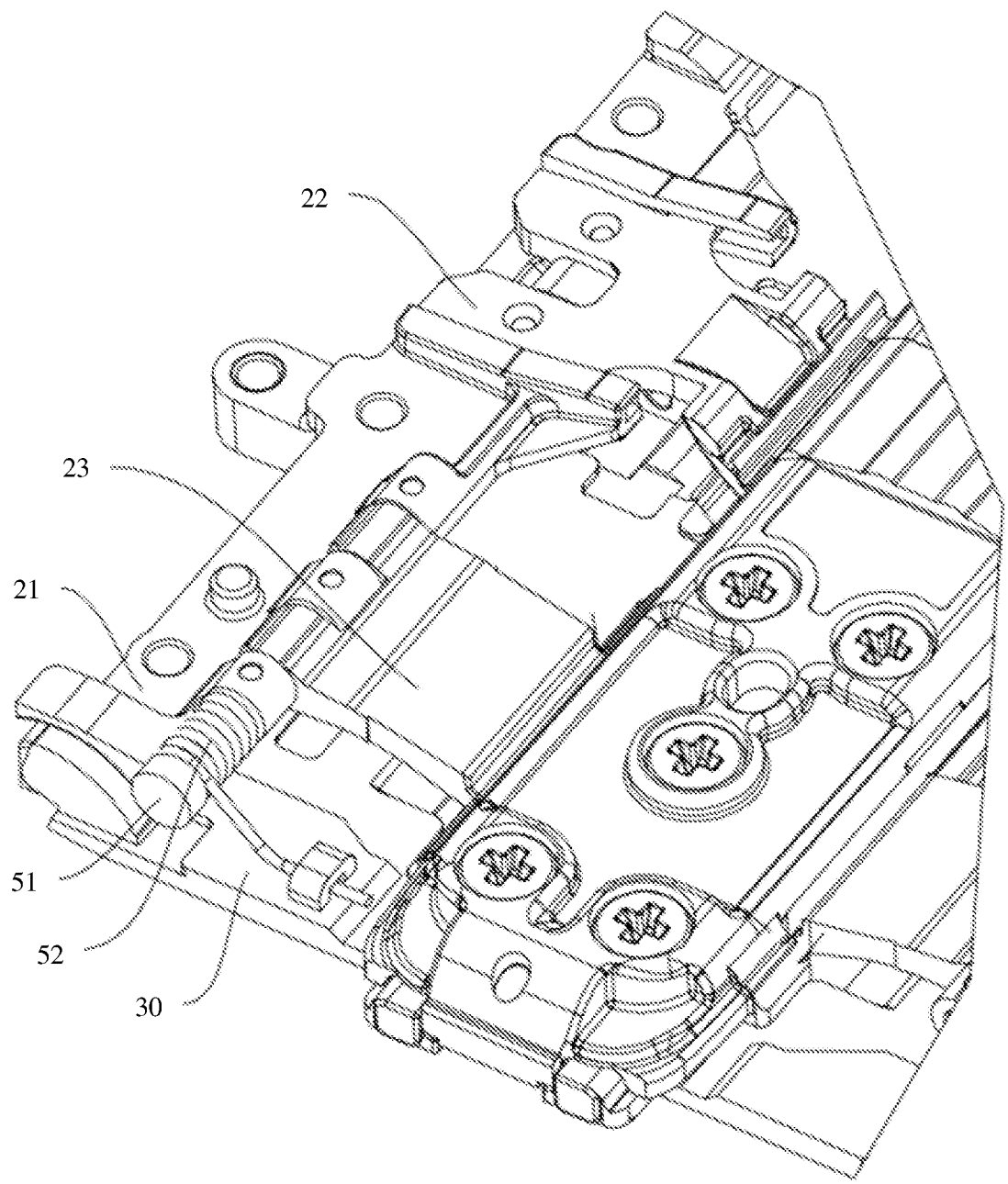
FIG. 13 is a partial schematic structural diagram of a foldable mechanism shown in FIG. 8.
Figure 14:
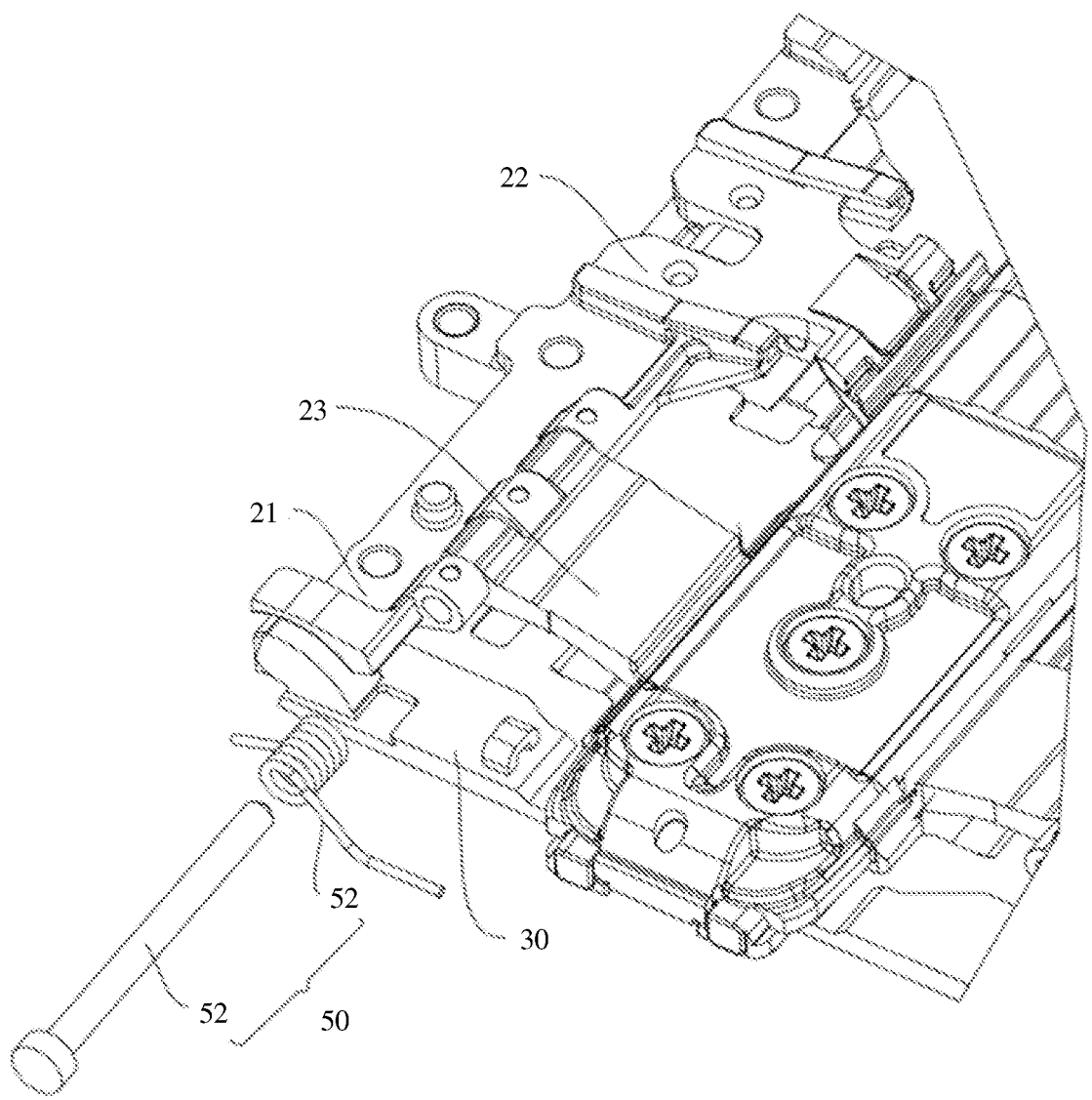
FIG. 14 is a schematic exploded view of a partial structure of a foldable mechanism shown in FIG. 13.

Referring to FIG. 13 and FIG. 14, in a possible implementation, the foldable mechanism 100 further includes a first rotation assistance assembly 50, the first rotation assistance assembly 50 includes a second shaft 51 and a first elastic piece 52, the first rotating arm 23 is rotatably connected to the first mounting bracket 21 by using the second shaft 51, and the first elastic piece 52 is sleeved on the second shaft 51 and is elastically sandwiched between the first mounting bracket 21 and the first support plate 30.

It can be understood that a movement gap is reserved at a joint of parts in the foldable mechanism 100 that have a movement fitting relationship. The movement gap causes an angle deviation between the first support plate 30 and the second support plate 40 in a process in which the first support plate 30 and the second support plate 40 rotate relative to the middle housing 10. As a result, when the folding apparatus 1000 is in the closed state, an included angle between the first support plate 30 and the second support plate 40 cannot reach an angle required by a design. For example, the included angle between the first support plate 30 and the second support plate 40 may be smaller than the angle required by the design. As a result, the flexible display 1100 is pressed against, local stress of the flexible display 1100 increases, and the flexible display 1100 is more easily damaged. Therefore, by adding the first rotation assistance assembly 50, a possibility that the included angle between the first support plate 30 and the second support plate 40 cannot reach the angle required by the design due to the movement gap between the parts can be minimized, and the included angle between the first support plate 30 and the second support plate 40 can be made at an optimal angle required by the design.

For example, the first elastic piece 52 is a torsion spring, the torsion spring has two free ends, one free end of the torsion spring is connected to the first mounting bracket 21 and is fixed relative to a location of the first mounting bracket 21, and the other free end of the torsion spring is connected to the first support plate 30 and is fixed relative to a location of the first support plate 30. In other words, one free end of the torsion spring is fixedly connected to the first mounting bracket 21, and the other free end of the torsion spring is fixedly connected to the first support plate 30. For example, the free end of the torsion spring that is fixed to the first mounting bracket 21 may be fixed to the first mounting bracket 21 through bonding, clamping, or the like, and the free end of the torsion spring that is fixed to the first support plate 30 may be assembled into a corresponding locking structure on the first support plate 30 to be fixed to the first support plate 30. However, it should be understood that a manner in which the torsion spring is fixed to the first mounting bracket 21 and the first support plate 30 may be designed according to an actual requirement. This is not limited in this embodiment.

Therefore, torsion of the torsion spring can act on the first support plate 30, thereby exerting tension on the first support plate 30 in a direction toward the first mounting bracket 21. In the closed state of the folding apparatus 1000, the tension can eliminate the angle deviation caused by the movement gap between the parts, so that movement of the first support plate 30 reaches a designed angle, the included angle between the first support plate 30 and the second support plate 40 meets a design requirement, and a simple structure and superb performance are achieved.

Referring to FIG. 5, FIG. 11, and FIG. 12, the second mounting bracket 24 can be rotatably connected to the middle housing 10 by using the second rotating arm 26. For example, one end of the second rotating arm 26 is connected to the second mounting bracket 24, and the end of the second rotating arm 26 can rotate relative to the second mounting bracket 24; and the other end of the second rotating arm 26 is connected to the middle housing 10, and the other end of the second rotating arm 26 can rotate relative to the middle housing 10. In other words, one end of the second rotating arm 26 is rotatably connected to the second mounting bracket 24, and the other end of the second rotating arm 26 is rotatably connected to the middle housing 10.

For example, one end of the second rotating arm 26 may be rotatably connected to the second mounting bracket 24 by using a real shaft. An arc-shaped arm may be disposed at the other end of the second rotating arm 26, and an arc-shaped slot may be provided on the middle housing 10. The arc-shaped arm is mounted in the arc-shaped slot. The second rotating arm 26 and the middle housing 10 are rotatably connected by using a virtual shaft through relative movement between the arc-shaped arm and the arc-shaped slot. Alternatively, the second rotating arm 26 and the middle housing 10 may be rotatably connected by using a real shaft. This is not limited in this embodiment.

It can be understood that, for a specific form of the connection between the second rotating arm 26 and the second mounting bracket 24, reference may be made to the first rotation assistance assembly 50 between the first rotating arm 23 and the first mounting bracket 21. Details are not described herein again.

Therefore, a rotatable connection relationship of "the first rotating arm 23—the first mounting bracket 21—the first housing 200" and a rotatable connection relationship of "the second rotating arm 26—the second mounting bracket 24—the second housing 300" can be formed. In this way, the first mounting bracket 21 and the second mounting bracket 24 can be driven by the first rotating arm 23 and the second rotating arm 26 respectively to rotate relative to the middle housing 10, so that the first housing 200 and the second housing 300 are folded and unfolded relative to each other.

In this embodiment, when the first mounting bracket 21 is driven by the first rotating arm 23 to rotate relative to the middle housing 10, the first transmission arm 22 can slide relative to the first mounting bracket 21. In addition, when the second mounting bracket 24 is driven by the second rotating arm 26 to rotate relative to the middle housing 10, the second transmission arm 25 can slide relative to the second mounting bracket 24. The following describes a sliding principle about how the first transmission arm 22 can slide relative to the first mounting bracket 21 and the second transmission arm 25 can slide relative to the second mounting bracket 24.

Referring to FIG. 5, FIG. 11, and FIG. 12, the first transmission arm 22 includes a sliding structure 221 and a rotating part 222. The sliding structure 221 of the first transmission arm 22 is slidably connected to the first mounting bracket 21, and the rotating part 222 of the first transmission arm 22 is rotatably connected to the middle housing 10. For example, an arc-shaped arm may be disposed on the rotating part 222 of the first transmission arm 22, and an arc-shaped slot may be provided on the middle housing 10. The arc-shaped arm is mounted in the arc-shaped slot. The first transmission arm 22 and the middle housing 10 are rotatably connected by using a virtual shaft through relative movement (for example, sliding) between the arc-shaped arm and the arc-shaped slot. Alternatively, the first transmission arm 22 and the middle housing 10 may be rotatably connected by using a real shaft. This is not limited in this embodiment.

Therefore, the first transmission arm 22 can rotate relative to the middle housing 10. In other words, the first transmission arm 22 has a rotation center, and the rotation center of the first transmission arm 22 is a first axis C1. The rotation center (the first axis C1) of the first transmission arm 22 is a rotation center around which the first transmission arm 22 rotates relative to the middle housing 10 and may be understood as a straight line around which the first transmission arm 22 can rotate relative to the middle housing 10 in an angle range of 0° to 90°. The first rotating arm 23 can also rotate relative to the middle housing 10. In other words, the first rotating arm 23 has a rotation center, and the rotation center of the first rotating arm 23 is a second axis C2. The rotation center (the second axis C2) of the first rotating arm 23 is a rotation center around which the first rotating arm 23 rotates relative to the middle housing 10 and may be understood as a straight line around which the first rotating arm 23 can rotate relative to the middle housing 10 in an angle range of 0° to 90°.

The first axis C1 is farther away, than the second axis C2, from a periphery, of the middle housing 10, that is close to the first housing 200. The periphery, of the middle housing 10, that is close to the first housing 200 may be understood as a periphery of a long edge, of the middle housing 10, that is close to a side of the first housing 200, For example, a periphery, of peripheries of the middle housing 10, that is located in a width direction of the electronic device 2000 and that faces the side of the first housing 200. In other words, there is a distance difference between the first axis C1 and the second axis C2.

For example, the first axis C1 and the second axis C2 are not collinear, and the first axis C1 and the second axis C2 are staggered due to the distance difference. Based on this, when the first rotating arm 23 and the first transmission arm 22 rotate relative to the middle housing 10, the first rotating arm 23 rotates earlier than the first transmission arm 22, and the first transmission arm 22 rotates later than the first rotating arm 23.

Therefore, by using a position differential principle that the first axis C1 and the second axis C2 are staggered so that a position differential occurs during rotation of the first transmission arm 22 and the first rotating arm 23, the first transmission arm 22 and the first mounting bracket 21 can slide relative to each other during rotation of the first transmission arm 22 and the first rotating arm 23.

Referring to FIG. 5, FIG. 11, and FIG. 12, for example, the sliding structure 221 of the first transmission arm 22 includes a first sliding body 223 and a first shaft 224. The first sliding body 223 includes a front facet 225, a back facet 226, and a peripheral side face 227 connecting the front facet 225 and the back facet 226. The front facet 225, the back facet 226, and the peripheral side face 227 of the first sliding body 223 are connected to each other to form an outer surface of the first sliding body 223. A first flange 228 is disposed on each of the front facet 225 and the back facet 226 of the first sliding body 223. The first flange 228 is connected to the guiding space 212 of the first sliding slot 211, and the first flange 228 can slide relative to the first sliding slot 211.

Therefore, the first sliding body 223 and the first sliding slot 211 can form a slipper mechanism, so that a relative sliding action between the first sliding body 223 and the first sliding slot 211 is implemented more easily and control precision is higher through fitting between the first flange 228 of the first sliding body 223 and the guiding space 212 of the first sliding slot 211.

In this embodiment, the first sliding body 223 is not only connected to the first mounting bracket 21, but also connected to the first support plate 30. For example, the peripheral side face 227 of the first sliding body 223 is concave inward to form a first concave region 229, so that the first sliding body 223 is in a "U" shape. One end of the first shaft 224 is connected to one side of the first concave region 229, and the other end of the first shaft 224 is connected to the other side of the first concave region 229.

Therefore, the first shaft 224 may be located substantially in the first concave region 229. Further, the first shaft 224 may be connected to a corresponding structure on the first support plate 30. In other words, the first sliding body 223 may be connected to the first support plate 30 by using the first shaft 224. In other words, the first transmission arm 22 may be connected to the first support plate 30 by using the first shaft 224. Therefore, the first concave region 229 can accommodate not only the first shaft 224, but also a part of a structure of the first support plate 30, thereby facilitating connection between the first shaft 224 and the first sliding body 223 and connection between the first shaft 224 and the first support plate 30, and reducing space occupied by the foldable mechanism 100, so that the folding apparatus 1000 and the electronic device 2000 in which the folding apparatus 1000 is used can be light and thin.

Referring to FIG. 5, FIG. 11, and FIG. 12, the second transmission arm 25 includes a sliding structure 251 and a rotating part 252. The sliding structure 251 of the second transmission arm 25 is slidably connected to the second mounting bracket 24, and the rotating part 252 of the second transmission arm 25 is rotatably connected to the middle housing 10. For example, an arc-shaped arm may be disposed on the rotating part 252 of the second transmission arm 25, and an arc-shaped slot may be provided on the middle housing 10. The arc-shaped arm is mounted in the arc-shaped slot. The second transmission arm 25 and the middle housing 10 are rotatably connected by using a virtual shaft through relative movement (for example, sliding) between the arc-shaped arm and the arc-shaped slot. Alternatively, the second transmission arm 25 and the middle housing 10 may be rotatably connected by using a real shaft. This is not limited in this embodiment.

Therefore, the second transmission arm 25 can rotate relative to the middle housing 10. In other words, the second transmission arm 25 has a rotation center, and the rotation center of the second transmission arm 25 is a third axis C3. The rotation center (the third axis C3) of the second transmission arm 25 is a rotation center around which the second transmission arm 25 rotates relative to the middle housing 10 and may be understood as a straight line around which the second transmission arm 25 can rotate relative to the middle housing 10 in an angle range of 0° to 90°. The second rotating arm 26 can also rotate relative to the middle housing 10. In other words, the second rotating arm 26 has a rotation center, and the rotation center of the second rotating arm 26 is a fourth axis C4. The rotation center (the fourth axis C4) of the second rotating arm 26 is a rotation center around which the second rotating arm 26 rotates relative to the middle housing 10 and may be understood as a straight line around which the second rotating arm 26 can rotate relative to the middle housing 10 in an angle range of 0° to 90°.

The third axis C3 is farther away, than the fourth axis C4, from a periphery, of the middle housing 10, that is close to the second housing 300. The periphery, of the middle housing 10, that is close to the second housing 300 may be understood as a periphery of a long edge, of the middle housing 10, that is close to a side of the second housing 300, for example, a periphery, of peripheries of the middle housing 10, that is located in the width direction of the electronic device 2000 and that faces the side of the second housing 300. In other words, there is a distance difference between the third axis C3 and the fourth axis C4.

For example, the third axis C3 and the fourth axis C4 are not collinear, and the third axis C3 and the fourth axis C4 are staggered due to the distance difference. Based on this, when the second rotating arm 26 and the second transmission arm 25 rotate relative to the middle housing 10, the second rotating arm 26 rotates earlier than the second transmission arm 25, and the second transmission arm 25 rotates later than the second rotating arm 26.

Therefore, by using a position differential principle that the third axis C3 and the fourth axis C4 are staggered so that a position differential occurs during rotation of the second transmission arm 25 and the second rotating arm 26, the second transmission arm 25 and the second mounting bracket 24 can slide relative to each other during rotation of the second transmission arm 25 and the second rotating arm 26.

For example, the sliding structure 251 of the second transmission arm 25 includes a second sliding body 253 and a third shaft 254. The second sliding body 253 includes a front facet, a back facet, and a peripheral side face connecting the front facet and the back facet. The front facet, the back facet, and the peripheral side face of the second sliding body 253 are connected to each other to form an outer surface of the second sliding body 253. A second flange is disposed on each of the front facet and the back facet of the second sliding body 253. The second flange is connected to the guiding space 242 of the second sliding slot 241, and the second flange can slide relative to the second sliding slot 241.

Therefore, the second sliding body 253 and the second sliding slot 241 can form a slipper mechanism, so that a relative sliding action between the second sliding body 253 and the second sliding slot 241 is implemented more easily and control precision is higher through fitting between the second flange of the second sliding body 253 and the guiding space 242 of the second sliding slot 241.

In this embodiment, the second sliding body 253 is not only connected to the second mounting bracket 24, but also connected to the second support plate 40. For example, the peripheral side face of the second sliding body 253 is concave inward to form a second concave region, so that the second sliding body 253 is in a "U" shape. One end of the third shaft 254 is connected to one side of the second concave region, and the other end of the third shaft 254 is connected to the other side of the second concave region.

Therefore, the third shaft 254 may be located substantially in the second concave region. Further, the third shaft 254 may be connected to a corresponding structure on the second support plate 40. In other words, the second sliding body 253 may be connected to the second support plate 40 by using the third shaft 254. In other words, the second transmission arm 25 may be connected to the second support plate 40 by using the third shaft 254. Therefore, the second concave region can accommodate not only the third shaft 254, but also a part of a structure of the second support plate 40, thereby facilitating connection between the third shaft 254 and the second sliding body 253 and connection between the third shaft 254 and the second support plate 40, and reducing space occupied by the foldable mechanism 100, so that the folding apparatus 1000 and the electronic device 2000 in which the folding apparatus 1000 is used can be light and thin.

Based on the foregoing descriptions, it should be understood that the first transmission arm 22 is rotatably connected to the middle housing 10 and slidably connected to the first mounting bracket 21 to form a connecting rod slider structure, the first rotating arm 23 is rotatably connected to the middle housing 10 and rotatably connected to the first mounting bracket 21 to form a connecting rod structure, the second transmission arm 25 is rotatably connected to the middle housing 10 and slidably connected to the second mounting bracket 24 to form a connecting rod slider structure, and the second rotating arm 26 is rotatably connected to the middle housing 10 and rotatably connected to the second mounting bracket 24 to form a connecting rod structure.

Therefore, with the foldable mechanism 100, the first mounting bracket 21 and the second mounting bracket 24 can be connected to the middle housing 10 by using the connecting rod slider structure and the connecting rod structure. In this architecture, the foldable mechanism 100 has a few parts and a simple fitting relationship and fitting location, and constituent parts are easy to fabricate and assemble, thereby facilitating mass production. In addition, the first mounting bracket 21 is further linked to the first housing 200, and the second mounting bracket 24 is further linked to the second housing 300, so that the foldable mechanism 100 has relatively good overall mechanism tensile resistance and mechanism extrusion resistance.

In addition, the foldable mechanism 100 controls moving tracks of the first mounting bracket 21 and the first housing 200 by using both the first transmission arm 22 and the first rotating arm 23, and controls moving tracks of the second mounting bracket 24 and the second housing 300 by using both the second transmission arm 25 and the second rotating arm 26. Therefore, in a process in which the first housing 200 and the second housing 300 are folded relative to each other, the first mounting bracket 21 can drive the first housing 200 to move toward the middle housing 10, and the second mounting bracket 24 can drive the second housing 300 to move toward the middle housing 10; and in a process in which the first housing 200 and the second housing 300 are unfolded relative to each other, the first mounting bracket 21 drives the first housing 200 to move away from the middle housing 10, and the second mounting bracket 24 drives the second housing 300 to move away from the middle housing 10. For example, with the foldable mechanism 100, the housing can rotate inward in a process in which the folding apparatus 1000 changes from the flattened state to the closed state, and the housing can rotate outward in a process in which the folding apparatus 1000 changes from the closed state to the flattened state, so that during unfolding or folding of the folding apparatus 1000, a deformation movement of the flexible display 1100 can be implemented to reduce a risk of pulling or pressing against the flexible display 1100, so as to protect the flexible display 1100, improve reliability of the flexible display 1100, and make the flexible display 1100 and the electronic device 2000 have a relatively long service life.

Referring to FIG. 5, FIG. 11, and FIG. 12, in this embodiment, the first support plate 30 is movably connected to the sliding structure 221 of the first transmission arm 22, so that in a process in which the first housing 200 and the second housing 300 are folded or unfolded relative to each other, the first support plate 30 and the sliding structure 221 of the first transmission arm 22 slide and rotate relative to each other. Therefore, the first support plate 30 can be driven by the first transmission arm 22 to move along with the first transmission arm 22 when the first transmission arm 22 and the first mounting bracket 21 slide relative to each other. For example, the first support plate 30 can be driven by the first transmission arm 22, through sliding of the first transmission arm 22 relative to the first mounting bracket 21, to rotate relative to the middle housing 10, so that the first housing 200, the first support plate 30, and the middle housing 10 switch between a flattened state and a folded state.

It should be noted that the flattened state may be understood as that the first housing 200 and the first support plate 30 do not rotate relative to the middle housing 10, so that the first housing 200, the first support plate 30, and the middle housing 10 are flush with each other to jointly support the flexible display 1100. For example, in the flattened state, the first housing 200, the first support plate 30, and the middle housing 10 may be arranged in a straight line shape. The folded state may be understood as that the first housing 200 and the first support plate 30 rotate relative to the middle housing 10, so that the first housing 200 and the first support plate 30 are disposed at an included angle with the middle housing 10 to form accommodation space for accommodating the flexible display 1100. For example, in the folded state, the first housing 200, the first support plate 30, and the middle housing 10 may be arranged in an arc shape.

The second support plate 40 is movably connected to the sliding structure 251 of the second transmission arm 25, so that in a process in which the first housing 200 and the second housing 300 are folded or unfolded relative to each other, the second support plate 40 and the sliding structure 251 of the second transmission arm 25 slide and rotate relative to each other. Therefore, the second support plate 40 can be driven by the second transmission arm 25 to move along with the second transmission arm 25 when the second transmission arm 25 and the second mounting bracket 24 slide relative to each other. For example, the second support plate 40 can be driven by the second transmission arm 25, through sliding of the second transmission arm 25 relative to the second mounting bracket 24, to rotate relative to the middle housing 10, so that the second housing 300, the second support plate 40, and the middle housing 10 switch between a flattened state and a folded state.

It should be noted that the flattened state may be understood as that the second housing 300 and the second support plate 40 do not rotate relative to the middle housing 10, so that the second housing 300, the second support plate 40, and the middle housing 10 are flush with each other to jointly support the flexible display 1100. For example, in the flattened state, the second housing 300, the second support plate 40, and the middle housing 10 may be arranged in a straight line shape. The folded state may be understood as that the second housing 300 and the second support plate 40 rotate relative to the middle housing 10, so that the second housing 300 and the second support plate 40 are disposed at an included angle with the middle housing 10 to form accommodation space for accommodating the flexible display 1100. For example, in the folded state, the second housing 300, the second support plate 40, and the middle housing 10 may be arranged in an arc shape.

Based on this, the first transmission arm 22 can serve as an active driving structure of the first support plate 30, so that the first support plate 30 moves along with the first transmission arm 22 when the first transmission arm 22 slides relative to the first mounting bracket 21. In other words, the first transmission arm 22 can directly drive the first support plate 30 to move, so that the first support plate 30 can have sufficient thrust force to move stably and smoothly, thereby minimizing a possibility of unsmoothness or jamming during movement of the first support plate 30, and achieving high reliability. The second transmission arm 25 can serve as an active driving structure of the second support plate 40, so that the second support plate 40 moves along with the second transmission arm 25 when the first transmission arm 22 slides relative to the second mounting bracket 24. In other words, the second transmission arm 25 can directly drive the second support plate 40 to move, so that the second support plate 40 can have sufficient thrust force to move stably and smoothly, thereby minimizing a possibility of unsmoothness or jamming during movement of the second support plate 40, and achieving high reliability.

It should be understood that the first support plate 30 can move along with the first transmission arm 22, and the second support plate 40 can move along with the second transmission arm 25. This can achieve high control precision and small backlash during movement of the first support plate 30 and the second support plate 40. In addition, a support requirement of the flexible display 1100 can be better met. Therefore, when the folding apparatus 1000 is in the flattened state, the intermediate state, or the closed state, the first support plate 30 and the second support plate 40 together with the middle housing 10 can jointly provide strong support for the bending portion 1120 of the flexible display 1100, so that the flexible display 1100 is not easily damaged under external force, to improve reliability of the flexible display 1100 and extend a service life of the flexible display 1100 and the electronic device 2000.

Figure 15:
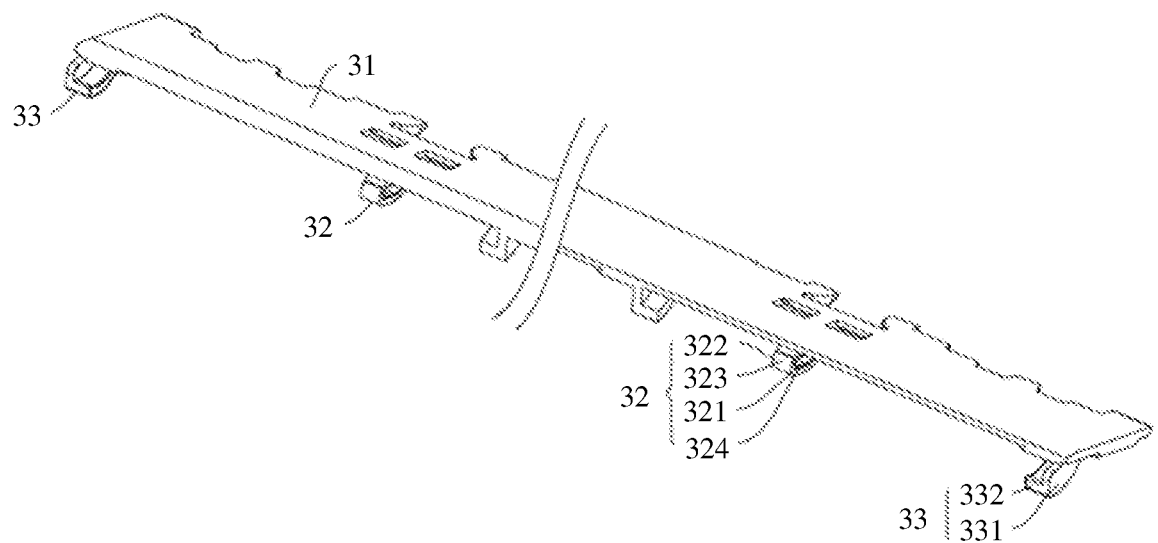
FIG. 15 is a schematic structural diagram of a first support plate of a foldable mechanism shown in FIG. 8.

Referring to FIG. 15, the first support plate 30 includes a first plate body 31, a first guiding structure 32, and a first rotating structure 33. The first guiding structure 32 and the first rotating structure 33 protrude from the first plate body 31, and are both located on a same side, of the first plate body 31, that faces the middle housing 10. The first rotating structure 33 is closer to an end of the first plate body 31 than the first guiding structure 32. The first support plate 30 is slidably connected to the first transmission arm 22 by using the first guiding structure 32 and is rotatably connected to the first mounting bracket 21 by using the first rotating structure 33.

For example, there are two first guiding structures 32 and two first rotating structures 33, one first guiding structure 32 and one first rotating structure 33 are arranged at an interval at the top of the first plate body 31, and the other first guiding structure 32 and the other first rotating structure 33 are arranged at an interval at the bottom of the first plate body 31. It should be understood that there may be a plurality of combinations and variations for a quantity and an arrangement relationship of the first guiding structure 32 and the first rotating structure 33. This is not limited in this embodiment.

In a possible implementation, the first support plate 30 may be an integrated mechanical part, and the integrated first support plate 30 has a few assembly steps, thereby helping reduce production time and costs.

Referring to FIG. 5, FIG. 11, and FIG. 12, the first guiding structure 32 is connected to the first concave region 229. Therefore, the first concave region 229 can accommodate not only the first shaft 224, but also the first guiding structure 32 of the first support plate 30, thereby facilitating connection between the first shaft 224 and the first guiding structure 32, and reducing space occupied by the foldable mechanism 100, so that the folding apparatus 1000 and the electronic device 2000 in which the folding apparatus 1000 is used can be light and thin.

In addition, the first guiding structure 32 and the first sliding body 223 can slide relative to each other. In other words, the first support plate 30 and the first transmission arm 22 can slide relative to each other. Therefore, the first support plate 30 can move along with the first transmission arm 22. For example, the first support plate 30 can be driven by the first transmission arm 22, through sliding of the first transmission arm 22 relative to the first mounting bracket 21, to rotate relative to the middle housing 10. Therefore, the first support plate 30 always has sufficient driving force because it is driven by the first transmission arm 22, and can move smoothly during movement, so that the first support plate 30 can move in place in a process in which the first housing 200 and the second housing 300 are folded or unfolded relative to each other, to better protect the flexible display 1100.

Still referring to FIG. 15, the first guiding structure 32 includes a front facet 321, a back facet 322, and a peripheral side face 323 connecting the front facet 321 and the back facet 322. The front facet 321, the back facet 322, and the peripheral side face 323 of the first guiding structure 32 are connected to each other to form an outer surface of the first guiding structure 32. For example, the first guiding structure 32 is in a crescent shape.

A first track slot 324 is provided on the first guiding structure 32. The first track slot 324 penetrates the front facet 321 and the back facet 322 of the first guiding structure 32, and the first track slot 324 does not penetrate the peripheral side face 323 of the first guiding structure 32. The first track slot 324 is used for the first shaft 224 to slide in the first track slot 324.

Therefore, the first track slot 324 can form an enclosed structure, and because of the closure property of the first track slot 324, the first shaft 224 can reciprocally slide only in movement space limited by the first track slot 324, thereby limiting the first shaft 224, and effectively preventing the first shaft 224 from accidentally detaching from the first track slot 324.

For example, one end of the first shaft 224 is connected to one side of the first concave region 229, the first shaft 224 passes through the first track slot 324, the other end of the first shaft 224 is connected to the other side of the first concave region 229, and the first shaft 224 can slide in the first track slot 324. In other words, the first shaft 224 passes through the first track slot 324 and can slide along an extension track of the first track slot 324. In other words, the sliding structure 221 of the first transmission arm 22 and the first support plate 30 can slide relative to each other.

It can be understood that, in a process in which the first transmission arm 22 slides relative to the first mounting bracket 21, the first shaft 224 can slide in the first track slot 324, so that the first support plate 30 moves along with the first transmission arm 22. In other words, in a process in which the first housing 200 and the second housing 300 are folded and unfolded relative to each other, the first transmission arm 22 can drive the first support plate 30 to rotate relative to the middle housing 10.

Therefore, by providing the first track slot 324, a sliding movement of the first shaft 224 in the first track slot 324 can be converted into a relative movement between the first transmission arm 22 and the first support plate 30, thereby implementing an active driving function that the first transmission arm 22 actively drives the first support plate 30 to move, so that the first transmission arm 22 has high usability, high practicability, and a wide application scope.

In this embodiment, a shape of an extension path of the first track slot 324 may be adjusted based on a track form required for performing a folding or unfolding movement by the flexible display 1100 and/or according to an actual movement requirement of the first support plate 30, to make a moving track of the flexible display 1100 adjustable. In other words, the extension path of the first track slot 324 is adjustable. In other words, a track of the first track slot 324 can be adjusted.

In a possible implementation, the extension path of the first track slot 324 is in an arc shape, so that the first track slot 324 is in an arc shape. Therefore, by adjusting a radian of the arc shape of the first track slot 324, a moving track of the first support plate 30 can be directly controlled, so that high control precision and small backlash can be achieved during movement of the first support plate 30, thereby avoiding pulling or pressing against the flexible display 1100 when the first support plate 30 moves along with the first transmission arm 22 to a specific angle, and effectively reducing screen stress of the flexible display 1100. In addition, a moving track of the flexible display 1100 can be indirectly adjusted, so that the radian of the arc shape of the first track slot 324 can better adapt to the moving track of the flexible display 1100, and the moving track of the flexible display 1100 is adjustable.

In another possible implementation, the extension path of the first track slot 324 is in a straight line shape, so that the first track slot 324 is in a linear shape.

Therefore, the extension path of the first track slot 324 may be designed so that in a process in which the first housing 200 and the second housing 300 are folded or unfolded relative to each other, an intermediate moving process, namely, a moving track, of the first support plate 30 can be designed, and a moving track of the flexible display 1100 can be controlled in the process, thereby avoiding excessive local stress of the flexible display 1100, and effectively reducing screen stress of the flexible display 1100. It should be understood that the extension path of the first track slot 324 may not be limited to the foregoing arc shape or straight line shape, but may be alternatively one or a combination of a curved shape, the straight line shape, and a broken line shape. This is not limited in this embodiment.

Referring to FIG. 5, FIG. 11, FIG. 12, and FIG. 15, the first rotating structure 33 and the first guiding structure 32 are located on a same side of the first plate body 31, and the first rotating structure 33 is in an arc shape and is mounted in the first rotating slot 213. The first support plate 30 is rotatably connected to the first mounting bracket 21 through fitting between the first rotating structure 33 and the first rotating slot 213.

Therefore, the first support plate 30 and the first mounting bracket 21 are rotatably connected by using a virtual shaft through relative movement between the first rotating structure 33 and the first rotating slot 213. In this architecture, a rotatable connection structure is simple, and small space is occupied, so that a thickness of the foldable mechanism 100 can be reduced, and the folding apparatus 1000 and the electronic device 2000 can be made light and thin more easily.

Figure 16:
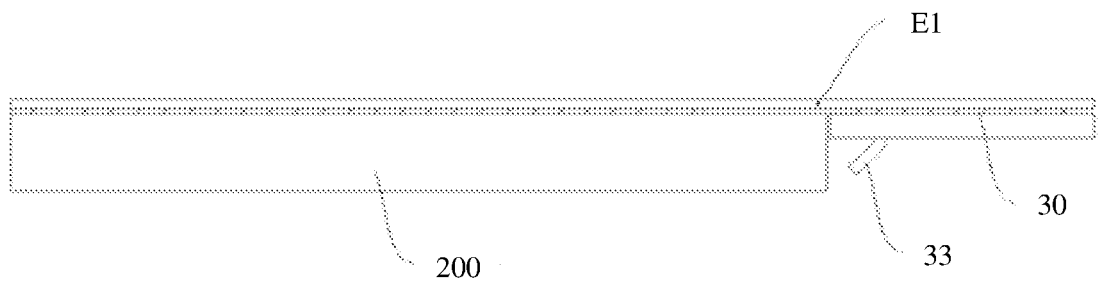
FIG. 16 is a simplified schematic diagram of a rotation center of a first support plate of a foldable mechanism shown in FIG. 8.

Referring to FIG. 16, it can be understood that the flexible display 1100 is attached to the first housing 200 and the first support plate 30, and a rotation center E1 of the first rotating structure 33 is located on the flexible display 1100. The rotation center may be understood as a straight line or an axis around which the first rotating structure 33 can rotate.

Therefore, a rotation center of the first support plate 30 (namely, the rotation center of the first rotating structure 33) can be located on the flexible display 1100, so that during rotation of the first support plate 30, a length of the flexible display 1100 can remain constant. In this way, it is ensured that the flexible display 1100 is not pulled or pressed against during bending of the screen, and a bending radius of the flexible display 1100 can be controlled herein. Therefore, damage caused to the flexible display 1100 during bending can be minimized, thereby achieving high reliability.

For example, the rotation center E1 of the first rotating structure 33 is located at a neutral layer of the flexible display 1100, so that the length of the flexible display 1100 can remain constant. It should be understood that, during bending of the flexible display 1100, an outer layer of the flexible display 1100 is subject to tensile force, and an inner layer of the flexible display 1100 is subject to extrusion force. However, a cross section of the outer layer and the inner layer of the flexible display 1100 includes a transition layer that is neither subject to tensile force nor subject to extrusion force. Stress at the transition layer is approximately zero, and the transition layer is the neutral layer of the flexible display 1100. For example, the neutral layer of the flexible display 1100 is a layer formed by all locations at which internal tangential stress of the flexible display 1100 is zero when the flexible display 1100 is bent or deformed. A length of the neutral layer of the flexible display 1100 during bending remains the same as that before bending.

It should be noted that FIG. 16 merely schematically describes the rotation center E1 of the first rotating structure 33, and does not limit a connection location, a specific structure, or a quantity of components. The inner layer and the outer layer of the flexible display 1100 may be selected based on an inward folding or outward folding state of the flexible display 1100. This is not limited.

Still referring to FIG. 5, FIG. 11, FIG. 12, and FIG. 15, in this embodiment, the first rotating structure 33 includes a first baffle plate 331 and a first arc-shaped arm 332 that protrude from the first plate body 31. The first arc-shaped arm 332 is connected to one side of the first baffle plate 331, and the first arc-shaped arm 332 is further connected to the first rotating slot 213 and can slide in the first rotating slot 213. For example, the first arc-shaped arm 332 may be in a crescent shape. The first baffle plate 331 is configured to support the first arc-shaped arm 332, to improve strength of the first rotating structure 33, and avoid failure of the foldable mechanism 100 due to breaking, damage, or the like of the first arc-shaped arm 332 during rotation.

In a possible implementation, the first baffle plate 331 and the first arc-shaped arm 332 may be integrated, and the integrated first rotating structure 33 has a few assembly steps, thereby helping reduce production time and costs.

It can be understood that the first arc-shaped arm 332 can rotate in the first rotating slot 213 when the first support plate 30 is driven by the first transmission arm 22 to move along with the first transmission arm 22. That the first arc-shaped arm 332 can rotate in the first rotating slot 213 may be understood as that the first arc-shaped arm 332 reciprocally slides in the first rotating slot 213. For example, in the first rotating slot 213, the first arc-shaped arm 332 can slide from one end of the first rotating slot 213 to the other end of the first rotating slot 213, and then slide from the other end of the first rotating slot 213 back to the one end of the first rotating slot 213, and repeat this process. In other words, the first arc-shaped arm 332 is rotatably connected to the first rotating slot 213.

Therefore, when the first transmission arm 22 slides relative to the first mounting bracket 21, the first transmission arm 22 can drive the first support plate 30 to rotate relative to the middle housing 10 through fitting between the first arc-shaped arm 332 and the first rotating slot 213. In other words, the first support plate 30 can rotate along with the first transmission arm 22 during sliding of the first transmission arm 22.

Figure 17:
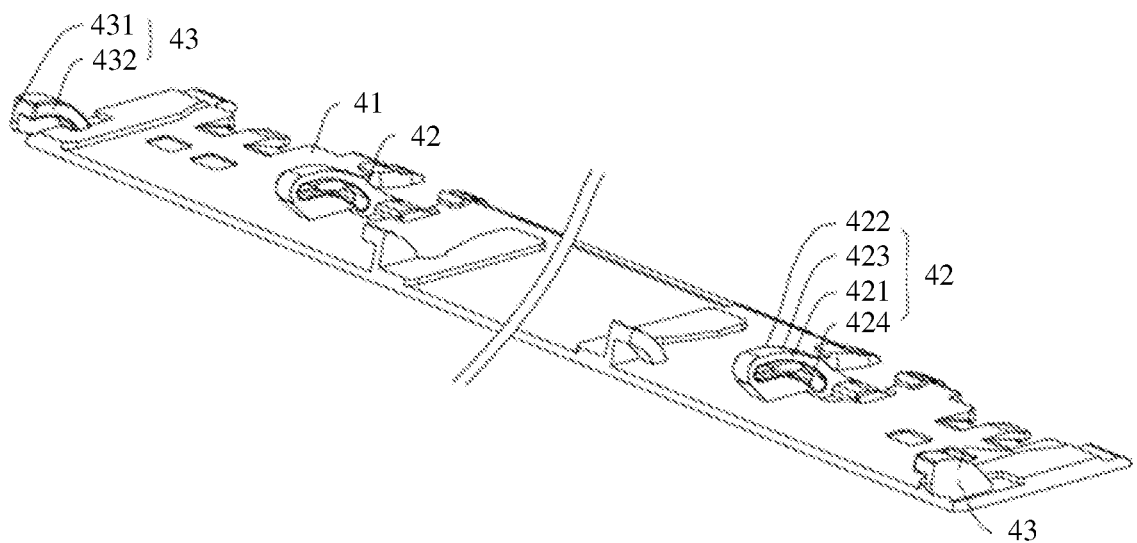
FIG. 17 is a schematic structural diagram of a second support plate of a foldable mechanism shown in FIG. 8.

Referring to FIG. 17, the second support plate 40 includes a second plate body 41, a second guiding structure 42, and a second rotating structure 43. The second guiding structure 42 and the second rotating structure 43 protrude from the second plate body 41, and are both located on a same side, of the second plate body 41, that faces the middle housing 10. The second rotating structure 43 is closer to an end of the second plate body 41 than the second guiding structure 42. The second support plate 40 is slidably connected to the second transmission arm 25 by using the second guiding structure 42 and is rotatably connected to the second mounting bracket 24 by using the second rotating structure 43.

For example, there are two second guiding structures 42 and two second rotating structures 43, one second guiding structure 42 and one second rotating structure 43 are arranged at an interval at the top of the second plate body 41, and the other second guiding structure 42 and the other second rotating structure 43 are arranged at an interval at the bottom of the second plate body 41. It should be understood that there may be a plurality of combinations and variations for a quantity and an arrangement relationship of the second guiding structure 42 and the second rotating structure 43. This is not limited in this embodiment.

In a possible implementation, the second support plate 40 may be an integrated mechanical part, and the integrated second support plate 40 has a few assembly steps, thereby helping reduce production time and costs.

Referring to FIG. 5, FIG. 11, and FIG. 12, the second guiding structure 42 is connected to the second concave region. Therefore, the second concave region can accommodate not only the third shaft 254, but also the second guiding structure 42 of the second support plate 40, thereby facilitating connection between the third shaft 254 and the second guiding structure 42, and reducing space occupied by the foldable mechanism 100, so that the folding apparatus 1000 and the electronic device 2000 in which the folding apparatus 1000 is used can be light and thin.

In addition, the second guiding structure 42 and the second sliding body 253 can slide relative to each other. In other words, the second support plate 40 and the second transmission arm 25 can slide relative to each other. Therefore, the second support plate 40 can move along with the second transmission arm 25. For example, the second support plate 40 can be driven by the second transmission arm 25, through sliding of the second transmission arm 25 relative to the second mounting bracket 24, to rotate relative to the middle housing 10. Therefore, the second support plate 40 always has sufficient driving force because it is driven by the second transmission arm 25, and can move smoothly during movement, so that the second support plate 40 can move in place in a process in which the first housing 200 and the second housing 300 are folded or unfolded relative to each other, to better protect the flexible display 1100.

Still referring to FIG. 17, the second guiding structure 42 includes a front facet 421, a back facet 422, and a peripheral side face 423 connecting the front facet 421 and the back facet 422. The front facet 421, the back facet 422, and the peripheral side face 423 of the second guiding structure 42 are connected to each other to form an outer surface of the second guiding structure 42. For example, the second guiding structure 42 is in a crescent shape.

A second track slot 424 is provided on the second guiding structure 42. The second track slot 424 penetrates the front facet 421 and the back facet 422 of the second guiding structure 42, and the second track slot 424 does not penetrate the peripheral side face 423 of the second guiding structure 42. The second track slot 424 is used for the third shaft 254 to slide in the second track slot 424.

Therefore, the second track slot 424 can form an enclosed structure, and because of the closure property of the second track slot 424, the third shaft 254 can reciprocally slide only in movement space limited by the second track slot 424, thereby limiting the third shaft 254, and effectively preventing the third shaft 254 from accidentally detaching from the second track slot 424.

For example, one end of the third shaft 254 is connected to one side of the second concave region, the third shaft 254 passes through the second track slot 424, the other end of the third shaft 254 is connected to the other side of the second concave region, and the third shaft 254 can slide in the second track slot 424. In other words, the third shaft 254 passes through the second track slot 424 and can slide along an extension track of the second track slot 424. In other words, the sliding structure 251 of the second transmission arm 25 and the second support plate 40 can slide relative to each other.

It can be understood that, in a process in which the second transmission arm 25 slides relative to the second mounting bracket 24, the third shaft 254 can slide in the second track slot 424, so that the second support plate 40 moves along with the second transmission arm 25. In other words, in a process in which the second housing 300 and the first housing 200 are folded and unfolded relative to each other, the second transmission arm 25 can drive the second support plate 40 to rotate relative to the middle housing 10.

Therefore, by providing the second track slot 424, a sliding movement of the third shaft 254 in the second track slot 424 can be converted into a relative movement between the second transmission arm 25 and the second support plate 40, thereby implementing an active driving function that the second transmission arm 25 actively drives the second support plate 40 to move, so that the second transmission arm 25 has high usability, high practicability, and a wide application scope.

In this embodiment, a shape of an extension path of the second track slot 424 may be adjusted based on a track form required for performing a folding or unfolding movement by the flexible display 1100 and/or according to an actual movement requirement of the second support plate 40, to make a moving track of the flexible display 1100 adjustable. In other words, the extension path of the second track slot 424 is adjustable.

In other words, a track of the second track slot 424 can be adjusted.

In a possible implementation, the extension path of the second track slot 424 is in an arc shape, so that the second track slot 424 is in an arc shape. Therefore, by adjusting a radian of the arc shape of the second track slot 424, a moving track of the second support plate 40 can be directly controlled, so that high control precision and small backlash can be achieved during movement of the second support plate 40, thereby avoiding pulling or pressing against the flexible display 1100 when the second support plate 40 moves along with the second transmission arm 25 to a specific angle, and effectively reducing screen stress of the flexible display 1100. In addition, a moving track of the flexible display 1100 can be indirectly adjusted, so that the radian of the arc shape of the second track slot 424 can better adapt to the moving track of the flexible display 1100, and the moving track of the flexible display 1100 is adjustable.

In another possible implementation, the extension path of the second track slot 424 is in a straight line shape, so that the second track slot 424 is in a linear shape.

Therefore, the extension path of the second track slot 424 may be designed, so that in a process in which the second housing 300 and the first housing 200 are folded or unfolded relative to each other, an intermediate moving process, namely, a moving track, of the second support plate 40 can be designed, and a moving track of the flexible display 1100 can be controlled in the process, thereby avoiding excessive local stress of the flexible display 1100, and effectively reducing screen stress of the flexible display 1100. It should be understood that the extension path of the second track slot 424 may not be limited to the foregoing arc shape or straight line shape, but may be alternatively one or a combination of a curved shape, the straight line shape, and a broken line shape. This is not limited in this embodiment.

Referring to FIG. 5, FIG. 11, FIG. 12, and FIG. 17, the second rotating structure 43 and the second guiding structure 42 are located on a same side of the second plate body 41, and the second rotating structure 43 is in an arc shape and is mounted in the second rotating slot 243. The second support plate 40 is rotatably connected to the second mounting bracket 24 through fitting between the second rotating structure 43 and the second rotating slot 243.

Therefore, the second support plate 40 and the second mounting bracket 24 are rotatably connected by using a virtual shaft through relative movement between the second rotating structure 43 and the second rotating slot 243. In this architecture, a rotatable connection structure is simple, and small space is occupied, so that a thickness of the foldable mechanism 100 can be reduced, and the folding apparatus 1000 and the electronic device 2000 can be made light and thin more easily.

Figure 18:
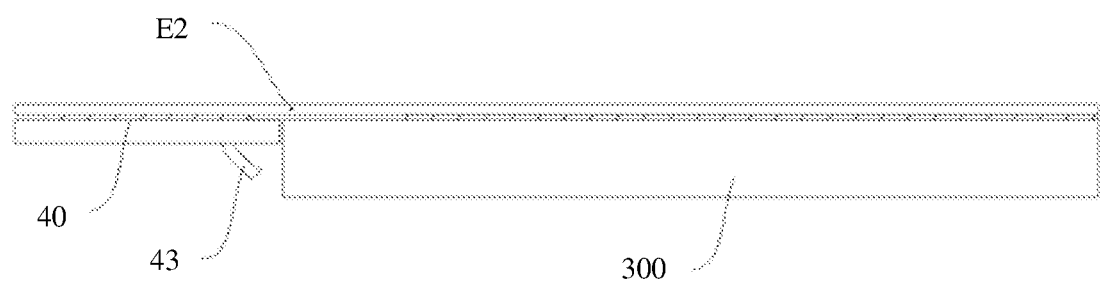
FIG. 18 is a simplified schematic diagram of a rotation center of a second support plate of a foldable mechanism shown in FIG. 8.

Referring to FIG. 18, it can be understood that the flexible display 1100 is attached to the second housing 300 and the second support plate 40, and a rotation center E2 of the second rotating structure 43 is located on the flexible display 1100. The rotation center may be understood as a straight line or an axis around which the second rotating structure 43 can rotate.

Therefore, a rotation center of the second support plate 40 (namely, the rotation center of the second rotating structure 43) can be located on the flexible display 1100, so that during rotation of the second support plate 40, a length of the flexible display 1100 can remain constant. In this way, it is ensured that the flexible display 1100 is not pulled or pressed against during bending of the screen, and a bending radius of the flexible display 1100 can be controlled herein. Therefore, damage caused to the flexible display 1100 during bending can be minimized, thereby achieving high reliability.

For example, the rotation center E2 of the second rotating structure 43 is located at a neutral layer of the flexible display 1100, so that the length of the flexible display 1100 can remain constant. It should be understood that, during bending of the flexible display 1100, an outer layer of the flexible display 1100 is subject to tensile force, and an inner layer of the flexible display 1100 is subject to extrusion force. However, a cross section of the outer layer and the inner layer of the flexible display 1100 includes a transition layer that is neither subject to tensile force nor subject to extrusion force. Stress at the transition layer is approximately zero, and the transition layer is the neutral layer of the flexible display 1100. For example, the neutral layer of the flexible display 1100 is a layer formed by all locations at which internal tangential stress of the flexible display 1100 is zero when the flexible display 1100 is bent or deformed. A length of the neutral layer of the flexible display 1100 during bending remains the same as that before bending.

It should be noted that FIG. 18 merely schematically describes the rotation center E2 of the second rotating structure 43 and does not limit a connection location, a specific structure, or a quantity of components.

In a possible implementation, the rotation center E2 of the second rotating structure 43 and the rotation center E1 of the first rotating structure 33 are symmetrically disposed. For example, the rotation center E2 and the rotation center E1 are symmetrically distributed on two sides of the flexible display 1100.

Referring to FIG. 5, FIG. 11, FIG. 12, and FIG. 17, the second rotating structure 43 includes a second baffle plate 431 and a second arc-shaped arm 432 that protrude from the second plate body 41. The second arc-shaped arm 432 is connected to one side of the second baffle plate 431, and the second arc-shaped arm 432 is further connected to the second rotating slot 243 and can slide in the second rotating slot 243. For example, the second arc-shaped arm 432 may be in a crescent shape. The second baffle plate 431 is configured to support the second arc-shaped arm 432, to improve strength of the second rotating structure 43, and avoid failure of the foldable mechanism 100 due to breaking, damage, or the like of the second arc-shaped arm 432 during rotation.

In a possible implementation, the second baffle plate 431 and the second arc-shaped arm 432 may be integrated, and the integrated second rotating structure 43 has a few assembly steps, thereby helping reduce production time and costs.

It can be understood that the second arc-shaped arm 432 can rotate in the second rotating slot 243 when the second support plate 40 is driven by the second transmission arm 25 to move along with the second transmission arm 25. That the second arc-shaped arm 432 can rotate in the second rotating slot 243 may be understood as that the second arc-shaped arm 432 reciprocally slides in the second rotating slot 243. For example, in the second rotating slot 243, the second arc-shaped arm 432 can slide from one end of the second rotating slot 243 to the other end of the second rotating slot 243, and then slide from the other end of the second rotating slot 243 back to the one end of the second rotating slot 243, and repeat this process. In other words, the second arc-shaped arm 432 is rotatably connected to the second rotating slot 243.

Therefore, when the second transmission arm 25 slides relative to the second mounting bracket 24, the second transmission arm 25 can drive the second support plate 40 to rotate relative to the middle housing 10 through fitting between the second arc-shaped arm 432 and the second rotating slot 243. In other words, the second support plate 40 can rotate along with the second transmission arm 25 during sliding of the second transmission arm 25.

Figure 19:
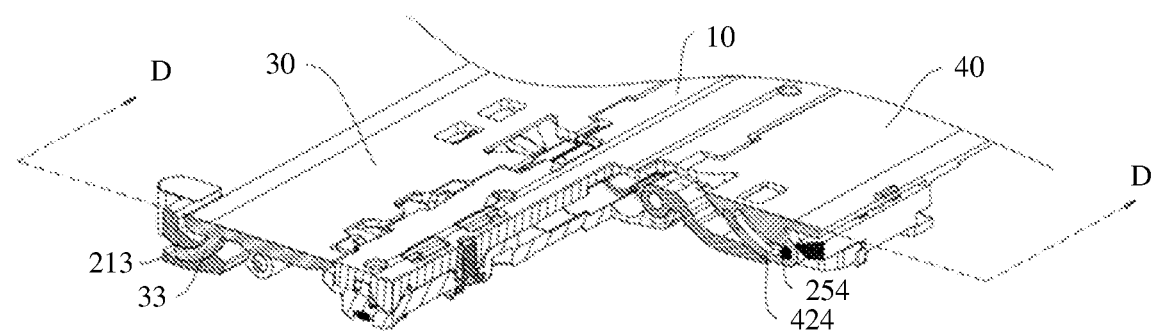
FIG. 19 is a schematic cross-sectional view of a foldable mechanism of a folding apparatus that is cut along a line D-D in a flattened state according to an embodiment.
Figure 20:
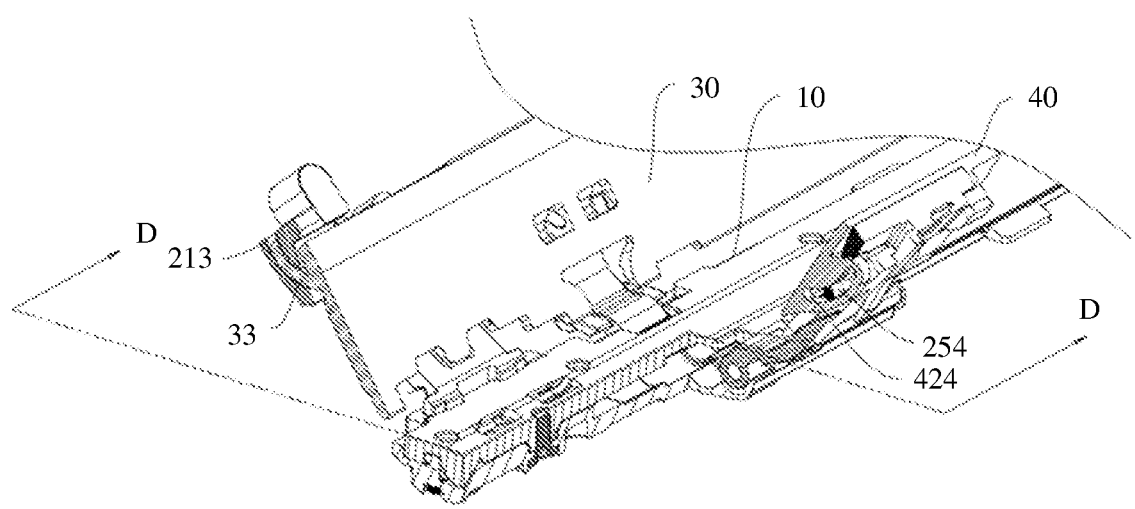
FIG. 20 is a schematic cross-sectional view of a foldable mechanism of a folding apparatus that is cut along a line D-D in an intermediate state according to an embodiment.
Figure 21:
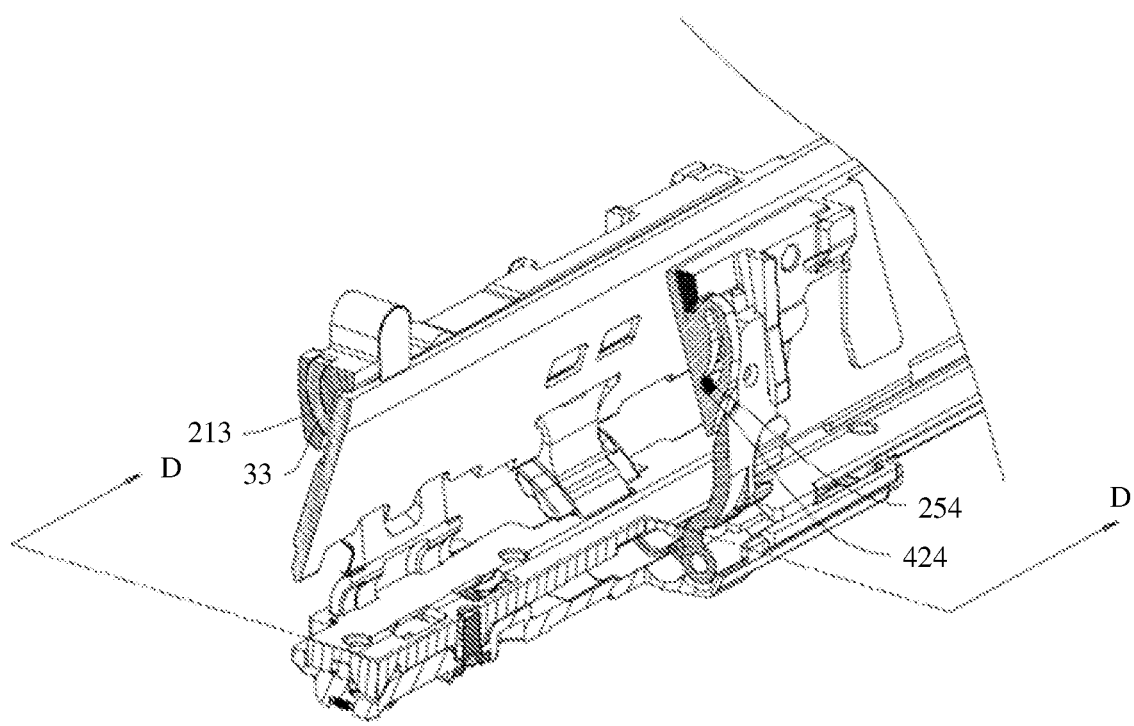
FIG. 21 is a schematic cross-sectional view of a foldable mechanism of a folding apparatus that is cut along a line D-D in a folded state according to an embodiment.

Referring to FIG. 19, FIG. 20, and FIG. 21, based on the foregoing descriptions, it should be understood that the first support plate 30 is slidably connected to the first transmission arm 22 and rotatably connected to the first mounting bracket 21, so that when the first transmission arm 22 slides relative to the first mounting bracket 21, the first support plate 30 can rotate relative to the middle housing 10 along with the first transmission arm 22. The second support plate 40 is slidably connected to the second transmission arm 25 and rotatably connected to the second mounting bracket 24, so that when the second transmission arm 25 slides relative to the second mounting bracket 24, the second support plate 40 can rotate relative to the middle housing 10 along with the second transmission arm 25.

Therefore, with the foldable mechanism 100, the first support plate 30 can rotate relative to the middle housing 10 under driving by the first track slot 324 of the first transmission arm 22, and the second support plate 40 can rotate relative to the middle housing 10 under driving by the second track slot 424 of the second transmission arm 25. Therefore, the first support plate 30 and the second support plate 40 are flush with the middle housing 10 to support the flexible display 1100 in a flattened state, or the first support plate 30 and the second support plate 40 rotate toward each other relative to the middle housing 10 to store the flexible display 1100 in a folded state. An angle range of an included angle between the first support plate 30 and the second support plate 40 may be within a range of 0° to 180° (a slight deviation is also allowed, for example, 182° or 185°). An angle range of a rotation angle of each of the first support plate 30 and the second support plate 40 may be within a range of 0° to 90° (a slight deviation is also allowed, for example, 92° or 95°).

Still referring to FIG. 6 and FIG. 7, for example, when the first housing 200 and the second housing 300 are folded relative to each other to a closed state, the first support plate 30, the middle housing 10, and the second support plate 40 jointly form accommodation space for accommodating the flexible display 1100. For example, the first support plate 30, the middle housing 10, and the second support plate 40 can jointly form accommodation space in a water droplet shape, and the accommodation space may be used to accommodate the bending portion 1120 of the flexible display 1100.

When the first housing 200 and the second housing 300 are unfolded relative to each other to an open state, the first support plate 30, the middle housing 10, and the second support plate 40 are flush with each other to support the flexible display 1100. For example, the first support plate 30, the middle housing 10, and the second support plate 40 can jointly support the bending portion 1120 of the flexible display 1100, so that the flexible display 1100 is flatter and is not easily damaged by touching by external force, thereby effectively improving reliability of the flexible display 1100.

Therefore, in this embodiment, when the folding apparatus 1000 is in the closed state, that is, when the first housing 200 and the second housing 300 are folded relative to each other to the closed state, the first support plate 30 and the second support plate 40 can form a three-section enclosure in an approximately arc shape together with the middle housing 10, to provide strong support for the bending portion 1120 of the flexible display 1100. In this way, a closed form of the bending portion 1120 of the flexible display 1100 can be relatively close to an ideal closed form, and therefore the folding apparatus 1000 can better support the flexible display 1100 in the closed form, so that the first housing 200 and the second housing 300 can be completely closed to minimize a possibility of a gap in the closed form of the entire device. In addition, the bending portion 1120 of the flexible display 1100 can remain at a specific bending radius while a minimum folding radius of the flexible display 1100 can meet a requirement of a designed value, and a screen form of the flexible display 1100 is controllable, so that the flexible display 1100 can be better protected to prevent the flexible display 1100 from being damaged by excessive folding, tension, compression, or other problems.

When the folding apparatus 1000 is in an unfolded state, that is, the first housing 200 and the second housing 300 are unfolded relative to each other to the flattened state, the first support plate 30 and the second support plate can form a three-section flat plate structure in an approximately straight line shape together with the middle housing 10, to provide strong support for the bending portion 1120 of the flexible display 1100, so that a flattened form of the bending portion 1120 of the flexible display 1100 can have relatively good flatness, and the folding apparatus 1000 can better support the flexible display 1100 in the flattened form.

Based on the foregoing descriptions, in this embodiment, the first support plate 30, the middle housing 10, and the second support plate 40 of the foldable mechanism 100 of the folding apparatus 1000 can jointly provide strong support for the flexible display 1100 in various forms, so that the flexible display 1100 is not easily dented under external force. This helps reduce a risk of damaging the display, and improves reliability of the flexible display 1100, so that the flexible display 1100 and the electronic device 2000 have a relatively long service life.

The embodiments are described in detail above. The principle and implementations of the embodiments are described herein by using specific examples. The description about the embodiments is merely provided to help understand the method and core ideas. In addition, persons of ordinary skill in the art can make variations and modifications in terms of the specific implementations and application scopes according to the ideas of the embodiments and the embodiments and related examples should be considered as non-limiting.

What is claimed is:

1. A folding apparatus, comprising: a first housing, a first support plate, and a middle housing that are configured to support a flexible display and that are sequentially arranged in an extension direction of the flexible display, and the folding apparatus further comprises a first mounting bracket, a first transmission arm, and a first rotating arm;

the first mounting bracket is fixed to the first housing, the first transmission arm is rotatably connected to the middle housing, a rotation center is a first axis, the first transmission arm is slidably connected to the first mounting bracket, and the first transmission arm is slidably connected to the first support plate;

the first rotating arm is rotatably connected to the middle housing, a rotation center is a second axis, the first rotating arm is rotatably connected to the first mounting bracket, and the second axis and the first axis are not collinear; and the first support plate is rotatably connected to the first mounting bracket, and the first support plate can be driven by the first transmission arm, through sliding of the first transmission arm relative to the first mounting bracket, to rotate relative to the middle housing, so that the first housing and the first support plate switch between a flattened state and a folded state.

2. The folding apparatus according to claim 1, wherein the first transmission arm comprises a sliding structure, the sliding structure of the first transmission arm comprises a first sliding body, a peripheral side face of the first sliding body is concave inward to form a first concave region, the first support plate comprises a first plate body and a first guiding structure that protrudes from the first plate body, the first guiding structure is connected to the first concave region, and the first guiding structure and the first sliding body can slide relative to each other.

3. The folding apparatus according to claim 2, wherein a first track slot is provided on the first guiding structure, the sliding structure of the first transmission arm further comprises a first shaft, one end of the first shaft is connected to one side of the first concave region, the first shaft passes through the first track slot, the other end of the first shaft is connected to the other side of the first concave region, and the first shaft can slide in the first track slot.

4. The folding apparatus according to claim 3, wherein the first track slot penetrates a front facet and a back facet of the first guiding structure, and the first track slot does not penetrate a peripheral side face of the first guiding structure.

5. The folding apparatus according to claim 3, wherein an extension path of the first track slot comprises an arc shape or a straight line shape.

6. The folding apparatus according to claim 2, wherein a first sliding slot is provided on the first mounting bracket, a side wall of the first sliding slot has concave guiding space, a first flange is disposed on each of a front facet and a back facet of the first sliding body, the first flange is connected to the guiding space of the first sliding slot, and the first flange can slide relative to the first sliding slot.

7. The folding apparatus according to claim 1, wherein a first rotating slot is provided on the first mounting bracket, the first rotating slot is in an arc shape, the first support plate further comprises a first rotating structure disposed on the first plate body, the first rotating structure and the first guiding structure are located on a same side of the first plate body, and the first rotating structure is in an arc shape and is mounted in the first rotating slot; and the first support plate is rotatably connected to the first mounting bracket through fitting between the first rotating structure and the first rotating slot.

8. The folding apparatus according to claim 7, wherein the first rotating structure comprises a first baffle plate and a first arc-shaped arm that protrude from the first plate body, the first arc-shaped arm is connected to one side of the first baffle plate, the first arc-shaped arm is further connected to the first rotating slot and can slide in the first rotating slot, and the first baffle plate is configured to support the first arc-shaped arm.

9. The folding apparatus according to claim 7, wherein a rotation center of the first rotating structure is located at a neutral layer of the flexible display.

10. The folding apparatus according to claim 1, further comprising a second support plate and a second housing, the first support plate and the second support plate are symmetrically distributed on two sides of the middle housing, and the second housing and the first housing are symmetrically distributed on two sides of the middle housing.

11. The folding apparatus according to claim 10, further comprising a second mounting bracket, a second transmission arm, and a second rotating arm;

the second mounting bracket is fixed to the second housing, the second transmission arm is rotatably connected to the middle housing, a rotation center is a third axis, the second transmission arm is slidably connected to the second mounting bracket, and the second transmission arm is slidably connected to the second support plate;

the second rotating arm is rotatably connected to the middle housing, a rotation center is a fourth axis, the second rotating arm is rotatably connected to the second mounting bracket, and the fourth axis and the third axis are not collinear; and the second support plate is rotatably connected to the second mounting bracket, and the second support plate can be driven by the second transmission arm, through sliding of the second transmission arm relative to the second mounting bracket, to rotate relative to the middle housing, so that the second housing and the second support plate switch between a flattened state and a folded state.

12. The folding apparatus according to claim 11, wherein when the first housing and the second housing are folded relative to each other to a closed state, the first support plate, the middle housing, and the second support plate jointly form accommodation space used to accommodate the flexible display; or when the first housing and the second housing are unfolded relative to each other to an open state, the first support plate, the middle housing, and the second support plate are flush with each other to support the flexible display.

13. The folding apparatus according to claim 11, wherein the second axis is closer, than the first axis, to a periphery, of the middle housing, that is close to the first housing; and the fourth axis is closer, than the third axis, to a periphery, of the middle housing, that is close to the second housing.

14. The folding apparatus according to claim 1, further comprising a first rotation assistance assembly, the first rotation assistance assembly comprises a second shaft and a first elastic piece, the first rotating arm is rotatably connected to the first mounting bracket by using the second shaft, and the first elastic piece is sleeved on the second shaft and is elastically sandwiched between the first mounting bracket and the first support plate.

15. The folding apparatus according to claim 14, wherein the first elastic piece is a torsion spring, the torsion spring has two free ends, one free end of the torsion spring is connected to the first mounting bracket, and the other free end of the torsion spring is connected to the first support plate.

16. An electronic device, comprising: a flexible display and a folding apparatus, and the flexible display is fixed to the folding apparatus;
- wherein the folding apparatus comprises a first housing, a first support plate, and a middle housing that are configured to support a flexible display and that are sequentially arranged in an extension direction of the flexible display, and the folding apparatus further comprises a first mounting bracket, a first transmission arm, and a first rotating arm;
- the first mounting bracket is fixed to the first housing, the first transmission arm is rotatably connected to the middle housing, a rotation center is a first axis, the first transmission arm is slidably connected to the first mounting bracket, and the first transmission arm is slidably connected to the first support plate;
- the first rotating arm is rotatably connected to the middle housing, a rotation center is a second axis, the first rotating arm is rotatably connected to the first mounting bracket, and the second axis and the first axis are not collinear; and
- the first support plate is rotatably connected to the first mounting bracket, and the first support plate can be driven by the first transmission arm, through sliding of the first transmission arm relative to the first mounting bracket, to rotate relative to the middle housing, so that the first housing and the first support plate switch between a flattened state and a folded state.

17. The electronic device according to claim 16, wherein the first transmission arm comprises a sliding structure, the sliding structure of the first transmission arm comprises a first sliding body, a peripheral side face of the first sliding body is concave inward to form a first concave region, the first support plate comprises a first plate body and a first guiding structure that protrudes from the first plate body, the first guiding structure is connected to the first concave region, and the first guiding structure and the first sliding body can slide relative to each other.

18. The electronic device according to claim 17, wherein a first track slot is provided on the first guiding structure, the sliding structure of the first transmission arm further comprises a first shaft, one end of the first shaft is connected to one side of the first concave region, the first shaft passes through the first track slot, the other end of the first shaft is connected to the other side of the first concave region, and the first shaft can slide in the first track slot.

19. The electronic device according to claim 18, wherein the first track slot penetrates a front facet and a back facet of the first guiding structure, and the first track slot does not penetrate a peripheral side face of the first guiding structure.

20. The electronic device according to claim 17, wherein a first sliding slot is provided on the first mounting bracket, a side wall of the first sliding slot has concave guiding space, a first flange is disposed on each of a front facet and a back facet of the first sliding body, the first flange is connected to the guiding space of the first sliding slot, and the first flange can slide relative to the first sliding slot.

* * * * *